United States Patent
Wu et al.

(10) Patent No.: US 7,227,176 B2
(45) Date of Patent: *Jun. 5, 2007

(54) ETCH STOP LAYER SYSTEM

(75) Inventors: Kenneth C. Wu, San Francisco, CA (US); Eugene A. Fitzgerald, Windham, NH (US); Gianni Taraschi, Andover, MA (US); Jeffrey T. Borenstein, Holliston, MA (US)

(73) Assignees: Massachusetts Institute of Technology, Cambridge, MA (US); The Charles Stark Draper Laboratory, Inc., Cambridge, MA (US)

( * ) Notice: Subject to any disclaimer, the term of this patent is extended or adjusted under 35 U.S.C. 154(b) by 241 days.

This patent is subject to a terminal disclaimer.

(21) Appl. No.: 10/603,852

(22) Filed: Jun. 25, 2003

(65) Prior Publication Data

US 2004/0000268 A1    Jan. 1, 2004

Related U.S. Application Data

(63) Continuation of application No. 09/599,260, filed on Jun. 22, 2000, now Pat. No. 6,689,211, which is a continuation-in-part of application No. 09/289,514, filed on Apr. 9, 1999, now Pat. No. 6,521,041.

(60) Provisional application No. 60/081,301, filed on Apr. 10, 1998.

(51) Int. Cl.
    *H01L 29/06* (2006.01)
(52) U.S. Cl. .................. 257/18; 257/190; 438/285; 438/590

(58) Field of Classification Search ............... 438/936, 438/285, 590
See application file for complete search history.

(56) References Cited

U.S. PATENT DOCUMENTS

| 4,010,045 A | 3/1977 | Ruehrwein |
| 4,704,302 A | 11/1987 | Bruel et al. |
| 4,710,788 A | 12/1987 | Dambkes et al. |

(Continued)

FOREIGN PATENT DOCUMENTS

DE          41 01 167          7/1992

(Continued)

OTHER PUBLICATIONS

Armstrong, "Technology for SiGe Heterostructure-Based CMOS Devices," Thesis Submitted to the Massachusetts Institute of Technology Department of Electrical Engineering and Computer Science on Jun. 30, 1999, pp. 1-154.

(Continued)

*Primary Examiner*—Douglas W. Owens
(74) *Attorney, Agent, or Firm*—Goodwin Procter LLP

(57) ABSTRACT

A semiconductor structure including a uniform etch-stop layer. The uniform etch stop layer has a relative etch rate which is less than approximately the relative etch rate of Si doped with $7\times10^{19}$ boron atoms/cm$^3$. A method for forming a semiconductor structure includes forming a uniform etch-stop layer providing a handle wafer, and bonding the uniform etch-stop layer to the handle wafer. The uniform etch-stop layer has a relative etch rate which is less than approximately the relative etch rate of Si doped with $7\times10^{19}$ boron atoms/cm$^3$.

66 Claims, 15 Drawing Sheets

U.S. PATENT DOCUMENTS

| | | | |
|---|---|---|---|
| 4,969,031 A | 11/1990 | Kobayashi et al. | |
| 4,987,462 A | 1/1991 | Kim et al. | |
| 4,990,979 A | 2/1991 | Otto | |
| 4,997,776 A | 3/1991 | Harame et al. | |
| 5,013,681 A * | 5/1991 | Godbey et al. | 438/459 |
| 5,089,872 A | 2/1992 | Ozturk et al. | |
| 5,091,767 A | 2/1992 | Bean et al. | |
| 5,155,571 A | 10/1992 | Wang et al. | |
| 5,166,084 A | 11/1992 | Pfiester | |
| 5,177,583 A | 1/1993 | Endo et al. | |
| 5,202,284 A | 4/1993 | Kamins et al. | |
| 5,207,864 A | 5/1993 | Bhat et al. | |
| 5,208,182 A | 5/1993 | Narayan et al. | |
| 5,212,110 A | 5/1993 | Pfiester et al. | |
| 5,221,413 A | 6/1993 | Brasen et al. | |
| 5,240,876 A | 8/1993 | Gaul et al. | |
| 5,241,197 A | 8/1993 | Murakami et al. | |
| 5,242,847 A | 9/1993 | Ozturk et al. | |
| 5,250,445 A | 10/1993 | Bean et al. | |
| 5,285,086 A | 2/1994 | Fitzgerald | |
| 5,291,439 A | 3/1994 | Kauffmann et al. | |
| 5,298,452 A | 3/1994 | Meyerson | |
| 5,310,451 A | 5/1994 | Tejwani et al. | |
| 5,316,958 A | 5/1994 | Meyerson | |
| 5,346,848 A | 9/1994 | Grupen-Shemansky et al. | |
| 5,374,564 A | 12/1994 | Bruel | |
| 5,399,522 A | 3/1995 | Ohori | |
| 5,413,679 A | 5/1995 | Godbey | |
| 5,424,243 A | 6/1995 | Takasaki | |
| 5,426,069 A | 6/1995 | Selvakumar et al. | |
| 5,426,316 A | 6/1995 | Mohammad | |
| 5,439,843 A | 8/1995 | Sakaguchi et al. | |
| 5,442,205 A | 8/1995 | Brasen et al. | |
| 5,461,243 A | 10/1995 | Ek et al. | |
| 5,461,250 A | 10/1995 | Burghartz et al. | |
| 5,462,883 A | 10/1995 | Dennard et al. | |
| 5,476,813 A | 12/1995 | Naruse | |
| 5,479,033 A | 12/1995 | Baca et al. | |
| 5,484,664 A | 1/1996 | Kitahara et al. | |
| 5,523,243 A | 6/1996 | Mohammad | |
| 5,523,592 A | 6/1996 | Nakagawa et al. | |
| 5,534,713 A | 7/1996 | Ismail et al. | |
| 5,536,361 A | 7/1996 | Kondo et al. | |
| 5,540,785 A | 7/1996 | Dennard et al. | |
| 5,548,128 A | 8/1996 | Soref et al. | |
| 5,572,043 A | 11/1996 | Shimizu et al. | |
| 5,596,527 A | 1/1997 | Tomioka et al. | |
| 5,607,876 A | 3/1997 | Biegelsen et al. | |
| 5,617,351 A | 4/1997 | Bertin et al. | |
| 5,630,905 A | 5/1997 | Lynch et al. | |
| 5,659,187 A | 8/1997 | Legoues et al. | |
| 5,683,934 A | 11/1997 | Candelaria | |
| 5,698,869 A | 12/1997 | Yoshimi et al. | |
| 5,714,777 A | 2/1998 | Ismail et al. | |
| 5,728,623 A | 3/1998 | Mori | |
| 5,739,567 A | 4/1998 | Wong | |
| 5,759,898 A | 6/1998 | Ek et al. | |
| 5,777,347 A | 7/1998 | Bartelink | |
| 5,786,612 A | 7/1998 | Otani et al. | |
| 5,786,614 A | 7/1998 | Chuang et al. | |
| 5,792,679 A | 8/1998 | Nakato | |
| 5,808,344 A | 9/1998 | Ismail et al. | |
| 5,821,577 A | 10/1998 | Crabbé et al. | |
| 5,847,419 A | 12/1998 | Imai et al. | |
| 5,863,830 A | 1/1999 | Bruel et al. | |
| 5,877,070 A | 3/1999 | Goesele et al. | |
| 5,882,987 A | 3/1999 | Srikrishnan | |
| 5,891,769 A | 4/1999 | Liaw et al. | |
| 5,906,708 A | 5/1999 | Robinson et al. | |
| 5,906,951 A * | 5/1999 | Chu et al. | 438/751 |
| 5,912,479 A | 6/1999 | Mori et al. | |
| 5,923,046 A | 7/1999 | Tezuka et al. | |
| 5,943,560 A | 8/1999 | Chang et al. | |
| 5,963,817 A * | 10/1999 | Chu et al. | 438/410 |
| 5,966,622 A | 10/1999 | Levine et al. | |
| 5,993,677 A | 11/1999 | Biasse et al. | |
| 5,998,807 A | 12/1999 | Lustig et al. | |
| 6,013,134 A | 1/2000 | Chu et al. | |
| 6,013,563 A | 1/2000 | Henley et al. | |
| 6,020,252 A | 2/2000 | Aspar et al. | |
| 6,033,974 A | 3/2000 | Henley et al. | |
| 6,033,995 A | 3/2000 | Muller | |
| 6,058,044 A | 5/2000 | Sugiura et al. | |
| 6,059,895 A | 5/2000 | Chu et al. | |
| 6,074,919 A | 6/2000 | Gardner et al. | |
| 6,096,590 A | 8/2000 | Chan et al. | |
| 6,103,559 A | 8/2000 | Gardner et al. | |
| 6,103,597 A | 8/2000 | Aspar et al. | |
| 6,103,599 A | 8/2000 | Henley et al. | |
| 6,107,653 A | 8/2000 | Fitzgerald | |
| 6,111,267 A | 8/2000 | Fischer et al. | |
| 6,117,750 A | 9/2000 | Bensahel et al. | |
| 6,130,453 A | 10/2000 | Mei et al. | |
| 6,133,799 A | 10/2000 | Favors et al. | |
| 6,140,687 A | 10/2000 | Shimomura et al. | |
| 6,143,636 A | 11/2000 | Forbes et al. | |
| 6,153,495 A | 11/2000 | Kub et al. | |
| 6,154,475 A * | 11/2000 | Soref et al. | 372/45 |
| 6,160,303 A | 12/2000 | Fattaruso | |
| 6,162,688 A | 12/2000 | Gardner et al. | |
| 6,162,705 A | 12/2000 | Henley et al. | |
| 6,184,111 B1 | 2/2001 | Henley et al. | |
| 6,190,998 B1 | 2/2001 | Bruel et al. | |
| 6,191,007 B1 | 2/2001 | Matsui et al. | |
| 6,191,432 B1 | 2/2001 | Sugiyama et al. | |
| 6,194,722 B1 | 2/2001 | Fiorini et al. | |
| 6,204,529 B1 | 3/2001 | Lung et al. | |
| 6,207,977 B1 | 3/2001 | Augusto | |
| 6,210,988 B1 | 4/2001 | Howe et al. | |
| 6,218,677 B1 | 4/2001 | Broekaert | |
| 6,225,192 B1 | 5/2001 | Aspar et al. | |
| 6,228,694 B1 | 5/2001 | Doyle et al. | |
| 6,232,138 B1 | 5/2001 | Fitzgerald et al. | |
| 6,235,567 B1 | 5/2001 | Huang | |
| 6,235,568 B1 | 5/2001 | Murthy et al. | |
| 6,242,324 B1 | 6/2001 | Kub et al. | |
| 6,249,022 B1 | 6/2001 | Lin et al. | |
| 6,251,751 B1 | 6/2001 | Chu et al. | |
| 6,251,755 B1 | 6/2001 | Furukawa et al. | |
| 6,261,929 B1 | 7/2001 | Gehrke et al. | |
| 6,266,278 B1 | 7/2001 | Harari et al. | |
| 6,271,551 B1 | 8/2001 | Schmitz et al. | |
| 6,271,726 B1 | 8/2001 | Fransis et al. | |
| 6,281,532 B1 | 8/2001 | Doyle et al. | |
| 6,290,804 B1 | 9/2001 | Henley et al. | |
| 6,291,321 B1 | 9/2001 | Fitzgerald | |
| 6,303,468 B1 | 10/2001 | Aspar et al. | |
| 6,313,016 B1 | 11/2001 | Kibbel et al. | |
| 6,316,301 B1 | 11/2001 | Kant | |
| 6,323,108 B1 | 11/2001 | Kub et al. | |
| 6,326,664 B1 | 12/2001 | Chau et al. | |
| 6,326,667 B1 | 12/2001 | Sugiyama et al. | |
| 6,329,063 B2 | 12/2001 | Lo et al. | |
| 6,335,546 B1 | 1/2002 | Tsuda et al. | |
| 6,339,232 B1 | 1/2002 | Takagi | |
| 6,344,417 B1 | 2/2002 | Usenko | |
| 6,346,459 B1 | 2/2002 | Usenko et al. | |
| 6,350,993 B1 | 2/2002 | Chu et al. | |
| 6,352,909 B1 | 3/2002 | Usenko | |
| 6,355,493 B1 | 3/2002 | Usenko | |
| 6,368,733 B1 | 4/2002 | Nishinaga | |
| 6,368,938 B1 | 4/2002 | Usenko | |
| 6,369,438 B1 | 4/2002 | Sugiyama et al. | |
| 6,372,356 B1 | 4/2002 | Thornton et al. | |

| | | | | | | |
|---|---|---|---|---|---|---|
| 6,372,593 B1 | 4/2002 | Hattori et al. | | 2001/0003364 A1 | 6/2001 | Sugawara et al. |
| 6,372,609 B1 | 4/2002 | Aga et al. | | 2001/0007789 A1 | 7/2001 | Aspar et al. |
| 6,387,829 B1 | 5/2002 | Usenko et al. | | 2002/0043660 A1 | 4/2002 | Yamazaki et al. |
| 6,391,740 B1 | 5/2002 | Cheung et al. | | 2002/0063292 A1 | 5/2002 | Armstrong |
| 6,399,970 B2 | 6/2002 | Kubo et al. | | 2002/0084000 A1 | 7/2002 | Fitzgerald |
| 6,403,975 B1 | 6/2002 | Brunner et al. | | 2002/0096717 A1 | 7/2002 | Chu et al. |
| 6,407,406 B1 | 6/2002 | Tezuka | | 2002/0100942 A1 | 8/2002 | Fitzgerald et al. |
| 6,410,371 B1 | 6/2002 | Yu et al. | | 2002/0123167 A1 | 9/2002 | Fitzgerald |
| 6,420,937 B1 | 7/2002 | Akatsuka et al. | | 2002/0123183 A1 | 9/2002 | Fitzgerald |
| 6,425,951 B1 | 7/2002 | Chu et al. | | 2002/0125471 A1 | 9/2002 | Fitzgerald et al. |
| 6,429,061 B1 | 8/2002 | Rim | | 2002/0125497 A1 | 9/2002 | Fitzgerald |
| 6,445,016 B1 | 9/2002 | An et al. | | 2002/0140031 A1 | 10/2002 | Rim |
| 6,448,152 B1 | 9/2002 | Henley et al. | | 2002/0167048 A1 | 11/2002 | Tweet et al. |
| 6,455,397 B1 | 9/2002 | Belford | | 2002/0168864 A1 | 11/2002 | Cheng et al. |
| 6,458,672 B1 | 10/2002 | Henley et al. | | 2002/0190284 A1 | 12/2002 | Murthy et al. |
| 6,475,072 B1 | 11/2002 | Canaperi et al. | | 2003/0003679 A1 | 1/2003 | Doyle et al. |
| 6,489,639 B1 | 12/2002 | Hoke et al. | | 2003/0013305 A1 | 1/2003 | Sugii et al. |
| 6,514,836 B2 | 2/2003 | Belford | | 2003/0013323 A1 | 1/2003 | Hammond et al. |
| 6,515,335 B1 | 2/2003 | Christiansen et al. | | 2003/0034529 A1 | 2/2003 | Fitzgerald et al. |
| 6,521,041 B2 * | 2/2003 | Wu et al. ............ 117/94 | | 2003/0057439 A1 | 3/2003 | Fitzgerald |
| 6,524,935 B1 | 2/2003 | Canaperi et al. | | 2003/0102498 A1 | 6/2003 | Braithwaite et al. |
| 6,534,381 B2 | 3/2003 | Cheung et al. | | 2003/0119280 A1 | 6/2003 | Lee et al. |
| 6,555,839 B2 | 4/2003 | Fitzgerald | | 2003/0127646 A1 | 7/2003 | Christiansen et al. |
| 6,563,152 B2 | 5/2003 | Roberds et al. | | 2003/0139000 A1 | 7/2003 | Bedell et al. |
| 6,573,126 B2 | 6/2003 | Cheng et al. | | 2003/0157787 A1 | 8/2003 | Murthy et al. |
| 6,583,015 B2 | 6/2003 | Fitzgerald et al. | | 2003/0160300 A1 | 8/2003 | Takenaka et al. |
| 6,583,437 B2 | 6/2003 | Mizuno et al. | | 2003/0178681 A1 | 9/2003 | Clark et al. |
| 6,591,321 B1 | 7/2003 | Arimilli et al. | | 2003/0189229 A1 | 10/2003 | Mouli |
| 6,593,191 B2 | 7/2003 | Fitzgerald | | 2003/0199126 A1 | 10/2003 | Chu et al. |
| 6,593,625 B2 | 7/2003 | Christiansen et al. | | 2003/0201458 A1 | 10/2003 | Clark et al. |
| 6,596,610 B1 | 7/2003 | Kuwabara et al. | | 2003/0203600 A1 | 10/2003 | Chu et al. |
| 6,597,016 B1 | 7/2003 | Yuki et al. | | 2003/0207127 A1 | 11/2003 | Murthy et al. |
| 6,602,613 B1 | 8/2003 | Fitzgerald | | 2003/0215990 A1 | 11/2003 | Fitzgerald et al. |
| 6,603,156 B2 | 8/2003 | Rim | | 2003/0218189 A1 | 11/2003 | Christiansen |
| 6,605,498 B1 | 8/2003 | Murthy et al. | | 2003/0219957 A1 | 11/2003 | Kuwabara et al. |
| 6,607,948 B1 | 8/2003 | Sugiyama et al. | | 2003/0227036 A1 | 12/2003 | Sugiyama et al. |
| 6,621,131 B2 | 9/2003 | Murthy et al. | | 2003/0227057 A1 | 12/2003 | Lochtefeld et al. |
| 6,624,047 B1 | 9/2003 | Sakaguchi et al. | | 2003/0230778 A1 | 12/2003 | Park et al. |
| 6,624,478 B2 | 9/2003 | Anderson et al. | | 2003/0232467 A1 | 12/2003 | Anderson et al. |
| 6,632,724 B2 | 10/2003 | Henley et al. | | 2004/0005740 A1 | 1/2004 | Lochtefeld et al. |
| 6,635,909 B2 | 10/2003 | Clark et al. | | 2004/0007715 A1 | 1/2004 | Webb et al. |
| 6,645,831 B1 | 11/2003 | Shaheen et al. | | 2004/0007724 A1 | 1/2004 | Murthy et al. |
| 6,646,322 B2 | 11/2003 | Fitzgerald | | 2004/0009649 A1 | 1/2004 | Kub et al. |
| 6,649,480 B2 | 11/2003 | Fitzgerald et al. | | 2004/0012037 A1 | 1/2004 | Venkatesan et al. |
| 6,649,492 B2 | 11/2003 | Chu et al. | | 2004/0012075 A1 | 1/2004 | Bedell et al. |
| 6,656,271 B2 | 12/2003 | Yonehara et al. | | 2004/0014276 A1 | 1/2004 | Murthy et al. |
| 6,657,223 B1 | 12/2003 | Wang et al. | | 2004/0014304 A1 | 1/2004 | Bhattacharyya |
| 6,664,169 B1 | 12/2003 | Iwasaki et al. | | 2004/0018699 A1 | 1/2004 | Boyd et al. |
| 6,674,150 B2 | 1/2004 | Takagi et al. | | 2004/0031979 A1 | 2/2004 | Lochtefeld |
| 6,677,183 B2 | 1/2004 | Sakaguchi et al. | | 2004/0031990 A1 | 2/2004 | Jin et al. |
| 6,677,192 B1 | 1/2004 | Fitzgerald | | 2004/0041174 A1 | 3/2004 | Okihara |
| 6,680,240 B1 | 1/2004 | Maszara | | 2004/0041210 A1 | 3/2004 | Mouli |
| 6,680,260 B2 | 1/2004 | Akiyama et al. | | 2004/0048091 A1 | 3/2004 | Sato et al. |
| 6,689,211 B1 * | 2/2004 | Wu et al. ............ 117/94 | | 2004/0048454 A1 | 3/2004 | Sakaguchi |
| 6,690,043 B1 | 2/2004 | Usuda et al. | | 2004/0051140 A1 | 3/2004 | Bhattacharyya |
| 6,703,144 B2 | 3/2004 | Fitzgerald | | 2004/0053477 A1 | 3/2004 | Ghyselen et al. |
| 6,703,648 B1 | 3/2004 | Xiang et al. | | 2004/0075149 A1 | 4/2004 | Fitzgerald et al. |
| 6,703,688 B1 | 3/2004 | Fitzgerald | | 2004/0084735 A1 | 5/2004 | Murthy et al. |
| 6,706,614 B1 | 3/2004 | An et al. | | 2004/0111901 A1 | 6/2004 | Schrom et al. |
| 6,706,618 B2 | 3/2004 | Takisawa et al. | | | | |
| 6,707,106 B1 | 3/2004 | Wristers et al. | | FOREIGN PATENT DOCUMENTS | | |
| 6,709,903 B2 | 3/2004 | Christiansen | | | | |
| 6,709,909 B2 | 3/2004 | Mizuno et al. | | EP | 0 514 018 | 11/1992 |
| 6,713,326 B2 | 3/2004 | Cheng et al. | | EP | 0 587 520 | 3/1994 |
| 6,723,661 B2 | 4/2004 | Fitzergald | | EP | 0 683 522 A2 | 11/1995 |
| 6,730,551 B2 | 5/2004 | Lee et al. | | EP | 0 828 296 | 3/1998 |
| 6,737,670 B2 | 5/2004 | Cheng et al. | | EP | 0 828 296 A | 3/1998 |
| 6,743,684 B2 | 6/2004 | Liu | | EP | 0 829 908 | 3/1998 |
| 6,750,130 B1 | 6/2004 | Fitzgerald | | EP | 0 838 858 | 4/1998 |
| 6,790,747 B2 | 9/2004 | Henley et al. | | EP | 1 020 900 | 7/2000 |
| 6,828,214 B2 | 12/2004 | Notsu et al. | | EP | 1 174 928 | 1/2002 |
| 6,890,835 B1 | 5/2005 | Chu et al. | | FR | 2 701 599 | 9/1993 |
| 2001/0003269 A1 | 6/2001 | Wu et al. | | GB | 2 342 777 | 4/2000 |

| | | |
|---|---|---|
| JP | 61/141116 | 6/1986 |
| JP | 02-098158 | 4/1990 |
| JP | 2/210816 | 8/1990 |
| JP | 3/036717 | 2/1991 |
| JP | 4-307974 | 10/1992 |
| JP | 5-166724 | 7/1993 |
| JP | 6-177046 | 6/1994 |
| JP | 06-196673 | 7/1994 |
| JP | 6-244112 | 9/1994 |
| JP | 6-252046 | 9/1994 |
| JP | 7-094420 | 4/1995 |
| JP | 7-106446 | 4/1995 |
| JP | 7-240372 | 9/1995 |
| JP | 9-219524 | 8/1997 |
| JP | 10-270685 | 10/1998 |
| JP | 11-233744 | 8/1999 |
| JP | 2000-021783 | 1/2000 |
| JP | 2000-31491 | 1/2000 |
| JP | 2001-319935 | 11/2001 |
| JP | 2002-076334 | 3/2002 |
| JP | 2002-164520 | 6/2002 |
| JP | 2002-289533 | 10/2002 |
| WO | WO 98/59365 | 12/1998 |
| WO | WO 99/53539 | 10/1999 |
| WO | WO 00/48239 | 8/2000 |
| WO | 00/54338 | 9/2000 |
| WO | 01/22482 | 3/2001 |
| WO | 01/54202 | 7/2001 |
| WO | 01/93338 | 12/2001 |
| WO | WO 01/99169 | 12/2001 |
| WO | 02/13262 | 2/2002 |
| WO | 02/15244 | 2/2002 |
| WO | 02/27783 | 4/2002 |
| WO | 02/47168 | 6/2002 |
| WO | 02/071488 | 9/2002 |
| WO | 02/071491 | 9/2002 |
| WO | 02/071495 | 9/2002 |
| WO | 02/082514 | 10/2002 |
| WO | 04/006311 | 1/2004 |
| WO | 04/006326 | 1/2004 |
| WO | 04/006327 | 1/2004 |
| WO | 04/019403 | 3/2004 |
| WO | 04/019404 | 3/2004 |

OTHER PUBLICATIONS

Barradas et al., "RBS analysis of MBE-grown SiGe/(001) Si heterostructures with thin, high Ge content SiGe channels for HMOS transistors," *Modern Physics Letters B*, (2000), abstract.

Borenstein et al., "A New Ultra-Hard Etch-Stop Layer for High Precision Micromachining," *Proceedings of the 1999 12th IEEE International Conference on Micro Electro Mechanical Systems (MEMs)*, Jan. 17-21, 1999, pp. 205-210.

Bruel et al., "® Smart Cut: A Promising New SOI Material Technology," *Proceedings of the 1995 IEEE International SOI Conference* (Oct. 1995), pp. 178-179.

Bruel, "Silicon on Insulator Material Technology," *Electronic Letters*, vol. 13, No. 14 (Jul. 6, 1995), pp. 1201-1202.

Brunner et al., "Molecular beam epitaxy growth and thermal stability of $Si_{1-x}Ge_x$ layers on extremely thin silicon-on-insulator substrates," *Thin Solid Films*, vol. 321 (1998), pp. 245-250.

Chang et al., "Selective Etching of SiGe/Si Heterostructures," *Journal of the Electrochemical Society*, No. 1 (Jan. 1991), pp. 202-204.

Chen et al., "The Band Model and the Etching Mechanism of Silicon in Aqueous KOH," *Journal of the Electrochemical Society*, vol. 142, No. 1 (Jan. 1995), pp. 170-176.

Cheng et al., "Electron Mobility Enhancement in Strained-Si n-MOSFETs Fabricated on SiGe-on-Insulator (SGOI) Substrates," *IEEE Electron Device Letters*, vol. 22, No. 7 (Jul. 2001), pp. 321-323.

Cheng et al., "Relaxed Silicon-Germanium on Insulator Substrate by Layer Transfer," *Journal of Electronic Materials*, vol. 30, No. 12 (2001), pp. L37-L39.

Feijoo et al., "Epitaxial Si-Ge Etch Stop Layers with Ethylene Diamine Pyrocatechol for Bonded and Etchback Silicon-on-Insulator," *Journal of Electronic Materials*, vol. 23, No. 6 (Jun. 1994), pp. 493-496.

Finne et al., "A Water-Amine-Complexing Agent System for Etching Silicon," *Journal of the Electrochemical Society*, vol. 114, No. 9 (Sep. 1967), pp. 965-970.

Fitzgerald et al., "Relaxed GexSi1-x structures for III-V integration with Si and high mobility two-dimensional electron gases in Si," *Journal of Vaccum Science and Technology B*, vol. 10, No. 4 (Jul./Aug. 1992), pp. 1807-1819.

Fitzgerald et al., "Totally Relaxed GexSi1-x Layers with Low Threading Dislocation Densities Grown on Si Substrates," *Applied Physics Letters*, vol. 59, No. 7 (Aug. 12, 1991), pp. 811-813.

Fukatsu, "SiGe-based semiconductor-on-insulator substrate created by low-energy separation-by-implanted-oxygen," *Applied Physics Letters*, vol. 72, No. 26 (Jun. 29, 1998), pp. 3485-3487.

Godbey et al., "A $Si_{0.7}Ge_{0.3}$ strained-layer etch stop for the generation of thin layer undoped silicon," *Applied Physics Letters*, vol. 56, No. 4 (Jan. 22, 1990), pp. 373-375.

Hackbarth et al., "Alternatives to thick MBE-grown relaxed SiGe buffers," *Thin Solid Films*, vol. 369, No. 1-2 (Jul. 2000), pp. 148-151.

Huang et al., "High-quality strain-relaxed SiGe alloy grown on implanted silicon-on-insulator substrate," *Applied Physics Letters*, vol. 76, No. 19 (May 8, 2000), pp. 2680-2682.

Ishikawa et al., "Creation of Si-Ge-based SIMOX structures by low energy oxygen implantation," *Proceedings of the 1997 IEEE International SOI Conference* (Oct. 1997), pp. 16-17.

Ishikawa et al., "SiGe-on-insulator substrate using SiGe alloy grown Si(001)," *Applied Physics Letters*, vol. 75, No. 7 (Aug 16, 1999), pp. 983-985.

Ismail, "Si/SiGe High-Speed Field-Effect Transistors," Electron Devices Meeting, Washington D.C., Dec. 10, 1995.

König et al., "Design Rules for n-Type SiGe Hetero FETs," *Solid State Electronics*, vol. 41, No. 10 (1997), pp. 1541-1547.

Leancu et al., "Anisotropic etching of germanium," *Sensors and Actuators A*, vol. 46-47 (1995), pp. 35-37.

LeGoues et al., "Relaxation of SiGe thin films grown on $Si/SiO_2$ substrates," *Applied Physics Letters*, vol. 75, No. 11 (Jun. 1, 1994), pp. 7240-7246.

Leitz et al., "Dislocation glide and blocking kinetics in compositionally graded SiGe/Si," *Journal of Applied Physics*, vol. 90, No. 6 (Sep. 15, 2001), pp. 2730-2736.

Maiti et al., "Strained-Si heterostructure field effect transistors," *Semiconductor Science and Technology*, vol. 13 (1998), pp. 1225-1246.

Mazara, "Silicon-On-Insulator by Wafer Bonding: A Review," *Journal of the Electrochemical Society*, No. 1 (Jan. 1991), pp. 341-347.

Mizuno et al., "Electron and Hole Mobility Enhancement in Strained-Si MOSFET's on SiGe-on-Insulator Substrates Fabricated by SIMOX Technology," *IEEE Electron Device Letters*, vol. 21, No. 5 (May 2000), pp. 230-232.

Narozny et al., "Si/SiGe Heterojunction Bipolar Transistor with Graded GAP SiGe Base Made by Molecular Beam Epitaxy," *IEEE IEDM* (1988), pp. 562-565.

Powell et al., "New approach to the growth of low dislocation relaxed SiGe material," *Applied Physics Letters*, vol. 64, No. 14 (Apr. 4, 1994), pp. 1865-1858.

Rim et al, "Fabrication and Analysis of Deep Submicron Strained-Si N-MOSFET's," *IEEE Transactions on Electron Devices*, vol. 47, No. 7 (Jul. 2000), pp. 1406-1415.

Sadek et al., "Design of Si/SiGe Heterojunction Complementary Metal-Oxide-Semiconductor Transistors," *IEEE Trans. Electron Devices*, vol. 43, No. 8 (Aug. 1996), pp. 1224-1232.

Seidel et al., "Anisotropic Etching of Crystalline Silicon in Alkaline Solutions," *Journal of the Electrochemical Society.*, vol. 137, No. 11 (Nov. 1990), pp. 3626-3632.

Shang et al., "The Development of an Anisotropic Si Etch Process Selective to $Ge_xSi_{1-x}$ Underlayers," *Journal of the Electrochemical Society.*, vol. 141, No. 2 (Feb. 1994), pp. 507-510.

Takagi et al., "On the Universality of Inversion Layer Mobility in Si MOSFET's: Part I-Effects of Substrate Impurity Concentration," *IEEE Transactions on Electron Devices*, vol. 41, No. 12 (Dec. 1994), pp. 2357-2362.

Ting et al., "Monolithic Integration of III-V Materials and Devices on Silicon," Part of the0 SPIE Conference on Silicon-Based Optoelectronics, San Jose, CA, (Jan. 1999), pp. 19-28.

Usami et al., "Spectroscopic study of Si-based quantum wells with neighboring confinement structure," *Semiconductor Science and Technology*, (1997), abstract.

Wu, "Novel Etch-Stop Materials for Silicon Micromachining," Thesis Submitted to the Massachusetts Institute of Technology Department of Materials Science and Engineering on May 9, 1997, pp. 1-62.

Yeo et al., "Nanoscale Ultra-Thin-Body Silicon-on-Insulator P-MOSFET with a SiGe/Si Heterostructure Channel," *IEEE Electron Device Letters*, vol. 21, No. 4 (Apr. 2000), pp. 161-163.

Yi et al., "$Si_{1-x}Ge_x$/Si Multiple Quantum Well Wires Fabricated Using Selective Etching," *Materials Research Society Symposium Proceedings*, vol. 379 (1995), pp. 91-96.

Zhang et al., "Demonstration of a GaAs-Based Compliant Substrate Using Wafer Bonding and Substrate Removal Techniques," Electronic Materials and Processing Research Laboratory, Department of Electrical Engineering, University Park, PA 16802, (1998), pp. 25-28.

IBM Technical Disclosure Bulletin, vol. 32, No. 8A, Jan. 1990, "Optimal Growth Technique and Structure for Strain Relaxation of Si-Ge Layers on Si Substrates," pp. 330-331.

Batterman, "Hillocks, Pits, and Etch Rate in Germanium Crystals," *Journal of Applied Physics*, vol. 28, No. 11 (Nov. 1957), pp. 1236-1241.

Bohg, "Ethylene Diamine-Pyrocatechol-Water Mixture Shows Etching Anomaly in Boron-Doped Silicon," *Journal of the Electrochemical Society*, vol. 118, No. 2 (Feb. 1971), pp. 401-402.

Desmond et al., "The Effects of Process-Induced Defects on the Chemical Selectivity of Highly Doped Boron Etch Stops in Silicon," *Journal of the Electrochemical Society*, vol. 141, No. 1 (Jan. 1994), pp. 178-184.

Ehman et al., "Morphology of Etch Pits on Germanium Studied by Optical and Scanning Electron Microscopy," *Journal of Applied Physics*, vol. 41, No. 7 (Jun. 1970), pp. 2824-2827.

Feijóo et al., "Etch Stop Barriers in Silicon Produced by Ion Implantation of Electrically Non-Active Species," *Journal of the Electrochemical Society*, vol. 139, No. 8 (Aug. 1992), pp. 2309-2313.

Fitzgerald, "GeSi/Si Nanostructures," *Annual Review of Materials Science*, vol. 25 (1995), pp. 417-454.

Frank, "Orientation-Dependent Dissolution of Germanium," *Journal of Applied Physics*, vol. 31, No. 11 (Nov. 1960), pp. 1996-1999.

Ghandi et al., "Chemical Etching of Germanium," *Journal of the Electrochemical Society*, vol. 135, No. 8 (Aug. 1988), pp. 2053-2054.

Herzog et al., "X-Ray Investigation of Boron- and Germanium-Doped Silicon Epitaxial Layers," *Journal of the Electrochemical Society*, vol. 131, No. 12 (Dec. 1984), pp. 2969-2974.

Holmes, "The Orientation Dependence of Etching Effects on Germanium Crystals," *Acta Metallurgica*, vol. 7, No. 4 (Apr. 1959), pp. 283-290.

Hunt et al., "Selective Etch Stop by Stress Compensation for Thin-Film BESOI," *1990 IEEE/SOI Technology Conference*, (Oct. 2-4, 1990), pp. 145-146.

Jaccodine, "Use if Modified Free Energy Theorems to Predict Equilibrium Growing and Etching Shapes," *Journal of Applied Physics*, vol. 33, No. 8 (Aug. 1962), pp. 2643-2647.

Kern, "Chemical Etching of Silicon, Germanium, Gallium, Arsenide, and Gallium Phosphide," *RCA Review*, vol. 39 (June 1978), pp. 278-308.

Lang et al., "Bulk Micromachining of Ge for IR Gratings," *Journal of Micromechanics and Microengineering*, vol. 6, No. 1 (Mar. 1996), pp. 46-48.

Leancu et al., "Anisotropic Etching of Germanium," *Sensors and Actuators*, A46-47 (1995), pp. 35-37.

Lehmann et al., "Implanted Carbon: An Effective Etch-Stop in Silicon," *Journal of the Electrochemical Society*, vol. 138, No. 5 (May 1991), pp. 3-4.

Palik et al., "Ellipsometric Study of the Etch-Stop Mechanism in Heavily Doped Silicon," *Journal of the Electrochemical Society*, vol. 132, No. 1 (Jan. 1985), pp. 135-141.

Palik et al., "Study of Bias-Dependent Etching of Si in Aqueous KOH," *Journal of the Electrochemical Society*, vol. 134, No. 2 (Feb. 1987), pp. 404-409.

Palik et al., "Study of the Etch-Stop Mechanism in Silicon," *Journal of the Electrochemical Society*, vol. 129, No. 9 (Sep. 1982), pp. 2051-2059.

Petersen et al., "Silicon as a Mechanical Material," *Proceedings of the IEEE*, vol. 70, No. 5 (May 1982), pp. 420-457.

Rai-Choudhury et al., "Doping of Epitaxial Silicon," *Journal of Crystal Growth*, vol. 7 (1970), pp. 361-367.

Raley et al., "(100) Silicon Etch-Rate Dependence on Boron Concentration in Ethylenediamine-Pyrocatechol-Water Solutions," *Journal of the Electrochemical Society*, vol. 131, No. 1 (Jan. 1984), pp. 161-170.

Senna et al., "Gallium Doping for Silicon Etch Stop in KOH," *Transducers '95/Eurosensors IX*, the 8th International Conference on Solid-State Sensors and Actuators and Eurosensors IX, Stockholm, Sweden, Jun. 25-29, 1995, pp. 194-195.

Soderbarg, "Fabrication of BESOI Materials Using Implanted Nitrogen as an Effective Etch Stop Barrier," *1989 IEEE SOS/SOI Technology Conference*, (Oct. 3-5, 1989), pp. 64.

Sundaram et al., "Electrochemical etching of Silicon by Hydrazine," *Journal of the Electrochemical Society*, vol. 140, No. 6 (Jun. 1993), pp. 1592-1597.

Sze, "Physics of Semiconductor Devices," (1991).

Vol'fson et al., "Fundamental Absorption Edge of Silicon Heavily Doped with Donor or Acceptor Impurities," *Soviet Physics Semiconductors*, vol. 1, No. 3 (Sep. 1967), pp. 327-332.

Armstrong et al., "Design of Si/SiGe Heterojunction Complementary Metal-Oxide-Semiconductor Transistors," IEDM Technical Digest (1995 International Electron Devices Meeting), pp. 761-764.

Augusto et al., "Proposal for a New Process Flow for the Fabrication of Silicon-based Complementary MOD-MOSFETs without Ion Implantation," *Thin Solid Films*, vol. 294, No. 1-2 (Feb. 15, 1997), pp. 254-258.

Bouillon et al., "Search for the optimal channel architecture for 0.18/0.12 μm bulk CMOS experimental study," IEEE, (1996), pp. 21.2.1-21.2.4.

Bufler et al., "Hole transport in strained $Si_{1-x}Ge_x$ alloys on $Si_{1-y}Ge_y$ substrates," *Journal of Applied Physics*, vol. 84, No. 10 (Nov. 15, 1998), pp. 5597-5602.

Burghartz et al., "Microwave Inductors and Capacitors in Standard Multilevel Interconnect Silicon Technology," *IEEE Transactions on Microwave Theory and Techniques*, vol. 44, No. 1 (Jan. 1996), pp. 100-104.

Canaperi et al., "Preparation of a relaxed Si-Ge layer on an insulator in fabricating high-speed semiconductor devices with strained epitaxial films," International Business Machines Corporation, 2002 (abstract).

Carlin et al., "High Efficiency GaAs-on-Si Solar Cells with High Voc Using Graded GeSi Buffers," IEEE (2000), pp. 1006-1011.

Cullis et al., "Growth ripples upon strained SiGe epitaxial layers on Si and misfit dislocation interactions," *Journal of Vacuum Science and Technology A*, vol. 12, No. 4 (Jul./Aug. 1994), pp. 1924-1931.

Currie et al., "Carrier mobilities and process stability of strained Si n- and p-MOSFETs on SiGe virtual substrates," *Journal of Vacuum Science and Technology B*, vol. 19, No. 6 (Nov./Dec. 2001), pp. 2268-2279.

Currie et al., "Controlling Threading Dislocation in Ge on Si Using Graded SiGe Layers and Chemical-Mechanical Polishing," *Applied Physics Letters*, vol. 72, No. 14 (Feb. 1998), pp. 1718-1720.

Eaglesham et al., "Dislocation-Free Stranski-Krastanow Growth of Ge on Si(100)," *Physical Review Letters*, vol. 64, No. 16 (Apr. 16, 1990), pp. 1943-1946.

Fischetti et al., "Band structure, deformation potentials, and carrier mobility in strained Si, Ge, and SiGe alloys," *Journal of Applied Physics*, vol. 80, No. 4 (Aug. 15, 1996), pp. 2234-2252.

Fischetti, "Long-range Coulomb interactions in small Si devices. Part II. Effective electronmobility in thin-oxide structures," *Journal of Applied Physics*, vol. 89, No. 2 (Jan. 15, 2001), pp. 1232-1250.

Fitzgerald et al., "Dislocation dynamics in relaxed graded composition semiconductors," *Materials Science and Engineering*, B67 (1999), pp. 53-61.

Garone et al., "Silicon vapor phase epitaxial growth catalysis by the presence of germane," *Applied Physics Letters*, vol. 56, No. 13 (Mar. 26, 1990), pp. 1275-1277.

Godbey et al., (1990) "Fabrication of Bond and Etch-Back Silicon Insulator Using a Strained $SI_{0.7}GE_{0.3}$ Layer as an Etch Stop," *Journal of the Electrical Society*, vol. 137, No. 10 (Oct. 1990) pp. 3219-3223.

Gray et al., "Analysis and Design of Analog Integrated Circuits," John Wiley & Sons, 1984, pp. 605-632.

Grillot et al., "Acceptor diffusion and segregation in $(Al_xGa_{1-x})_{0.5}In_{0.5}P$ heterostructures," *Journal of Applied Physics*, vol. 91, No. 8 (2002), pp. 4891-4899.

Grützmacher et al., "Ge segregation in SiGe/Si heterostructures and its dependence on deposition technique and growth atmosphere," *Applied Physics Letters*, vol. 63, No. 18 (Nov. 1, 1993), pp. 2531-2533.

Hackbarth et al., "Strain relieved SiGe buffers for Si-based heterostructure field-effect transistors," *Journal of Crystal Growth*, vol. 201/202 (1999), pp. 734-738.

Halsall et al., "Electron diffraction and Raman studies of the effect of substrate misorientation on ordering in the AlGaInP system," *Journal of Applied Physics*, vol. 85, No. 1 (1999), pp. 199-202.

Herzog et al., "SiGe-based FETs: Buffer Issues and Device Results," *Thin Solid Films*, vol. 380, No. 1-2 (Dec. 12, 2000), pp. 36-41.

Höck et al., "Carrier mobilities in modulation doped $Si_{1-x}Ge_x$ heterostructures with respect to FET applications," *Thin Solid Films*, vol. 336 (1998), pp. 141-144.

Höck et al., "High hole mobility in $Si_{0.17}Ge_{0.83}$ channel metal-oxide-semiconductor field-effect transistors grown by plasma-enhanced chemical vapor deposition," *Applied Physics Letters*, vol. 76, No. 26 (Jun. 26, 2000), pp. 3920-3922.

Höck et al., "High performance 0.25 μm p-type Ge/SiGe MODFETs," *Electronics Letters*, vol. 34, No. 19 (Sep. 17, 1998), pp. 1888-1889.

Hsu et al., "Surface morphology of related $Ge_xSi_{1-x}$ films," *Appl. Phys. Lett.*, vol. 61, No. 11 (1992), pp. 1293-1295.

Huang et al., "The Impact of Scaling Down to Deep Submicron on CMOS RF Circuits," *IEEE Journal of Solid-State Circuits*, vol. 33, No. 7 (Jul. 1998), pp. 1023-1036.

Huang et al., (2001) "Carrier Mobility enhancement in strained Si-on-insulator fabricated by wafer bonding", *2001 Symposium on VLSI Technology, Digest of Technical Papers*, pp. 57-58.

IBM Technical Disclosure Bulletin, "2 Bit/Cell EEPROM Cell Using Band to Band Tunneling for Data Read-Out," vol. 35, No. 4B (Sep. 1992), pp. 136-140.

Ismail et al., "Modulation-doped n-type Si/SiGe with Inverted Interface," *Applied Physics Letters*, vol. 65, No. 10 (Sep. 5, 1994), pp. 1248-1250.

Kearney et al., "The effect of alloy scattering on the mobility of holes in a $Si_{1-x}Ge_x$ quantum well," *Semiconductor Science and Technology*, vol. 13 (1998), pp. 174-180.

Kim et al., "A Fully Integrated 1.9-GHz CMOS Low-Noise Amplifier," *IEEE Microwave and Guided Wave Letters*, vol. 8, No. 8 (Aug. 1998), pp. 293-295.

Koester et al., "Extremely High Transconductance $Ge/Si_{0.4}Ge_{0.6}$ p-MODFET's Grown by UHV-CVD," *IEEE Electron Device Letters*, vol. 21, No. 3 (Mar. 2000), pp. 110-112.

König et al., "p-Type Ge-Channel MODFET's with High Transconductance Grown on Si Substrates," *IEEE Electron Device Letters*, vol. 14, No. 4 (Apr. 1993), pp. 205-207.

König et al., "SiGe HBTs and HFETs," *Solid-State Electronics*, vol. 38, No. 9 (1995), pp. 1595-1602.

Kummer et al., "Low energy plasma enhanced chemical vapor deposition," *Materials Science and Engineering B*, 89 (2002), pp. 288-295.

Kuznetsov et al., "Technology for high-performance nchannel SiGe modulation-doped field-effect transistors," *Journal of Vacuum Science and Technology B*, vol. 13, No. 6 (Nov./Dec. 1995), pp. 2892-2896.

Langdo et al., (2002) "Preparation of Novel SiGe-free Strained Si on Insulator Substrates" *IEEE International SOI Conference*, pp. 211-212 (XP002263057).

Larson, "Integrated Circuit Technology Options for RFIC's—Present Status and Future Directions," *IEEE Journal of Solid-State Circuits*, vol. 33, No. 3 (Mar. 1998), pp. 387-399.

Lee et al., "CMOS RF Integrated Circuits at 5 GHZ and Beyond," *Proceedings of the IEEE*, vol. 88, No. 10 (Oct. 2000), pp. 1560-1571.

Lee et al., "Strained Ge channel p-type metal-oxide-semiconductor field-effect transistors grown on $Si_{1-x}Ge_x$/Si virtual substrates," *Applied Physics Letters*, vol. 79, No. 20 (Nov. 12, 2001), pp. 3344-3346.

Lee et al., "Strained Ge channel p-type MOSFETs fabricated on $Si_{1-x}Ge_x$/Si virtual substrates," *Material Research Society Symposium Proceedings*, vol. 686 (2002), pp. A1.9.1-A1.9.5.

Leitz et al., "Channel Engineering of SiGe-Based Heterostructures for High Mobility MOSFETs," *Material Research Society Symposium Proceedings*, vol. 686 (2002), pp. A3.10.1-A3.10.6.

Leitz et al., "Hole mobility enhancements in strained $Si/Si_{1-y}Ge_y$ p-type metal-oxide-semiconductor field-effect transistors grown on relaxed $Si_{1-x}Ge_x$ (x<y) virtual substrates," *Applied Physics Letters*, vol. 79, No. 25 (Dec. 17, 2001), pp. 4246-4248.

Li et al., "Design of high speed Si/SiGe heterojunction complementary metal-oxide-semiconductor field effect transistors with reduced short-channel effects," *Vacuum Science and Technology A*, vol. 20, No. 3 (May/Jun. 2002), pp. 1030-1033.

Lu et al., "High Performance 0.1 μm Gate-Length P-Type SiGe MODFET's and MOS-MODFET's," *IEEE Transactions on Electron Devices*, vol. 47, No. 8 (Aug. 2000), pp. 1645-1652.

Meyerson et al., "Cooperative Growth Phenomena in Silicon/Germanium Low-Temperature Epitaxy," *Applied Physics Letters*, vol. 53, No. 25 (Dec. 19, 1988), pp. 2555-2557.

Mizuno et al., "Advanced SOI-MOSFETs with Strained-Si Channel for High Speed CMOS-Electron/Hole Mobility Enhancement," *Digest of Technical Papers, 2002 Symposium on VLSI Technology*, Honolulu, Jun. 13-15, New York, NY, pp. 210-211.

Mizuno et al., "High Performance Strained-Si p-MOSFETs on SiGe-on-Insulator Substrates Fabricated by SIMOX Technology," *IEEE IDEM Technical Digest*, (1999 International Electron Device Meeting), pp. 934-936.

Nayak et al., "High-Mobility Strained-Si PMOSFET's," *IEEE Transactions on Electron Devices*, vol. 43, No. 10 (Oct. 1996), pp. 1709-1716.

O'Neill et al., "SiGe Virtual Substrate N-Channel Heterojunction MOSFETs," *Semiconductor Science and Technology*, vol. 14 (1999), pp. 784-789.

Ota et al., "Application of heterojunction FET to power amplifier for cellular telephone," *Electronic Letters*, vol. 30, No. 11 (May 26, 1994), pp. 906-907.

Papananos, "Radio-Frequency Microelectronic Circuits for Telecommunication Applications," (1999), pp. 115-117, 188-193.

Parker et al., "SiGe Heterostructure CMOS Circuits and Applications," *Solid-State Electronics*, vol. 43 (1999), pp. 1497-1506.

Ransom et al., "Gate-Self-Aligned n-channel and p-channel Germanium MOSFET's," *IEEE Transactions on Electron Devices*, vol. 38, No. 12 (Dec. 1991), p. 2695.

Reinking et al., "Fabrication of high-mobility Ge p-channel MOSFETs on Si substrates," *Electronics Letters*, vol. 35, No. 6 (Mar. 18, 1999), pp. 503-504.

Rim, "Application of Silicon-Based Heterostructures to Enhanced Mobility Metal-Oxide-Semiconductor Field-Effect Transistors," Ph.D. Thesis, Stanford University, 1999, pp. 1-184.

Rim et al., "Enhanced Hole Mobilities in Surface-channel Strained-Si p-MOSFETs," *IEEE*, (1995), pp. 517-520.

Rim et al., "Fabrication and Analysis of Deep Submicron Strained-Si N-MOSFETs," *IEEE Transactions on Electron Devices*, vol. 47, No. 7 (Jul. 2000), pp. 1406-1415.

Robbins et al., "A model for heterogeneous growth of $Si_{1-x}Ge_x$ films for hydrides," *Journal of Applied Physics*, vol. 69, No. 6 (Mar. 15, 1991), pp. 3729-3732.

Sakaguchi et al., "ELTRAN by splitting porous Si layers," Proceedings of the 195th Int. SOI Symposium, Electrochemical Society, vol. 99-3 (1999), pp. 117-121.

Schäffler, "High-Mobility Si and Ge Structures," *Semiconductor Science and Technology*, vol. 12 (1997), pp. 1515-1549.

Sugimoto et al., "A 2V, 500 MHz and 3V, 920 MHz Low-Power Current-Mode 0.6 µm CMOS VCO Circuit," Institute of Electronics, Information and Communication Engineers, vol. E82-C, No. 7 (Jul. 1999), pp. 1327-1329.

Ternent et al., "Metal Gate Strained Silicon MOSFETs for Microwave Integrated Circuits," *IEEE* (Oct. 2000), pp. 38-43.

Tsang et al., "Measurements of alloy composition and strain in thin $Ge_xSi_{1-x}$ layers," *Journal of Applied Physics*, vol. 75, No. 12 (Jun. 15, 1994), pp. 8098-8108.

Tweet et al., "Factors determining the composition of strained GeSi layers grown with disilane and germane," *Applied Physics Letters*, vol. 65, No. 20 (Nov. 14, 1994), pp. 2579-2581.

Welser et al., "Electron Mobility Enhancement in Strained-Si N-Type Metal-Oxide-Semiconductor Field-Effect Transistors," *IEEE Electron Devices Letters*, vol. 15, No. 3 (Mar. 1994), pp. 100-102.

Welser et al., "Evidence of Real-Space Hot-Electron Transfer in High Mobility, Strained-Si Multilayer MOSFETs," *IEDM*, (1993), pp. 545-548.

Welser et al., "NMOS and PMOS Transistors Fabricated in Strained Silicon/Relaxed Silicon-Germanium Structures," *IEDM*, (1992), pp. 1000-1002.

Welser, "The Application of Strained-Silicon/Relaxed-Silicon Germanium Heterostructures to Metal-Oxide-Semiconductor Field-Effect Transistors," Ph.D. Thesis, Stanford University, Dept. of Electrical Engineering (1994), pp. 1-127.

Wolf et al., *Silicon Processing for the VLSI Era, vol. 1: Process Technology*, Lattice Press, Sunset Beach, CA, (1986), pp. 384-386.

Xie et al., "Semiconductor Surface Roughness: Dependence on Sign and Magnitude of Bulk Strain," *Physical Review Letters*, vol. 73, No. 22 (Nov. 28, 1994), pp. 3006-3009.

Xie et al., "Very high mobility two-dimensional hole gas in Si/$Ge_xSi_{1-x}$/Ge structures grown by molecular beam epitaxy," *Applied Physics Letters*, vol. 63, No. 16 (Oct. 18, 1993), pp. 2263-2264.

Xie, "SiGe field effect transistors," *Materials Science and Engineering*, vol. 25 (1999), pp. 89-121.

Yamagata et al., "Bonding, Splitting and Thinning by Porous Si in ELTRAN; SOI- Epi Wafer," *Material Research Society Symposium Proceedings*, vol. 681E (2001), pp. 18.2.1-18.2.10.

Canaperi et al., "Preparation of a relaxed Si-Ge layer on an insulator in fabricating high-speed semiconductor devices with sustained epitaxial films", IBM, USA (2002) (abstract).

Godbey et al., (1990) "Fabrication of Bond and Etch-Back Silicon Insulator Using a Strained $SI_{0.7}GE_{0.3}$ Layer as an Etch Stop," Journal of the Electrical Society, vol. 137, No. 10 (Oct. 1990) pp. 3219-3223.

Huang et al., (2001) "Carrier Mobility enhancement in strained Si-on-insulatoir fabricated by wafer bonding", 2001 Symposium on VLSI Technology, Digest of Technical Papers, pp. 57-58.

Langdo et al., (2002) "Preparation of Novel SiGe-free Strained Si on Insulator Substrates" IEEE International SOI Conference, pp. 211-212 (XP002263057).

Hamada et al., "A New Aspect of Mechanical Stress Effects in Scaled MOS Devices," *IEEE Transactions on Electron Devices*, vol. 38, No. 4 (Apr. 1991), pp. 895-900.

Huang et al., "Isolation Process Dependence of Channel Mobility in Thin-Film SOI Devices," *IEEE Electron Device Letters*, vol. 17, No. 6 (Jun. 1996), pp. 291-293.

Huang et al., "LOCOS-Induced Stress Effects on Thin-Film SOI Devices," *IEEE Electron Device Letters*, vol. 44, No. 4 (Apr. 1997), pp. 646-650.

Iida et al., "Thermal behavior of residual strain in silicon-on-insulator bonded wafer and effects on electron mobility," *Solid-State Electronics*, vol. 43 (1999), pp. 1117-1120.

Klauk et al., "Thermal stability of undoped strained Si channel SiGe heterostructures," American Institute of Physics, Apr. 1, 1996, pp. 1975-1977.

Tiwari et al., "Hole Mobility Improvement in Silicon-on-Insulator and Bulk Silicon Transistors Using Local Strain," IEEE International Electron Devices Meeting Technical Digest, (1997), pp. 939-941.

Uchino, et al., "A Raised Source/Drain Technology Using In-situ P-doped SiGe and B-doped Si for 0.1-µm CMOS ULSIs," IEEE International Electron Device Meeting Technical Digest, (1997), pp. 479-482.

Kuboto M., et al. "New SOI CMOS Process with Selective Oxidation, " IEEE IEDM Tech, Dig., pp. 814-816 (1986).

Ming et al., "Interfacial roughness scaling and strain in lattice mismatched $Si_{0.4}Ge_{0.6}$ thin films on Si" Applied Physics Letters, vol. 67, No. 5, Jul. 31, 1995, pp. 629-631.

Ming et al., "Microscopic structure of interfaces in $Si1$-xGex/Si heterostructures and superlattices studied by x-ray scattering and fluorescence yield, " Physical Review B, vol. 47, No. 24, pp. 373-81, Jun. 15, 1993.

Nishi et al. "Handbook of Semiconductor Manufacturing Technology," Marcel Dekker AG, New York, NY, 2000 pp. 1-22.

O'Neill, et al., "Deep Submicron CMOS Based on Silicon Germanium Technology," Fellow, IEEE Transactions on Electron Devices, vol. 43, No. 6, Jun. 1996 pp. 911-918.

Sugii, et al., "Role of Si1-xGex buffer layer on mobility enhancement in a strained-Si channel metal-oxide-semiconductor field-effect transistor," Central Research Laboratory, Hitachi Ltd. 1-280 Higashi-Koigakuboj, Kokubunji-shi, Tokyo 185-8601 Japan, pp. 2948-2950.

Vossen et al. "Thin Film Processes II" Academic Press Inc., San Diego, CA 1991, pp. 370-442.

Wolfe et al. "Silicon Processing for the VLSI ERA, vol. 1; Process Technology," Marcel Dekker AG, New York, NY, 2000, pp. 1-22.

\* cited by examiner

— 1.5 µm

THREADING
DISLOCATIONS

SILICON SUBSTRATE

— 1.3 µm

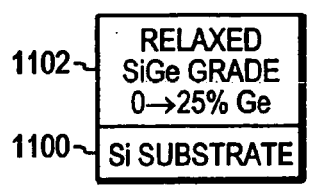
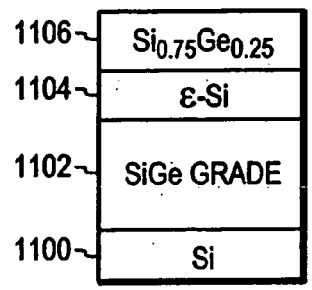
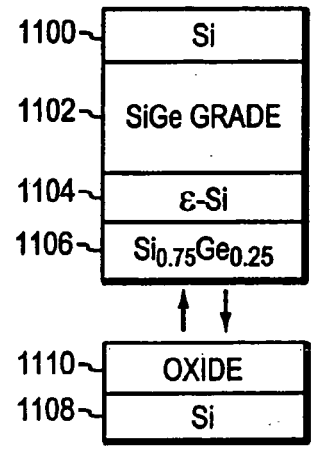
FIG. 11A      FIG. 11B      FIG. 11C
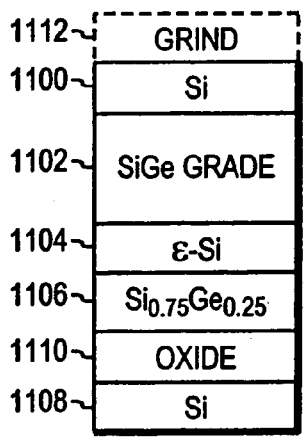
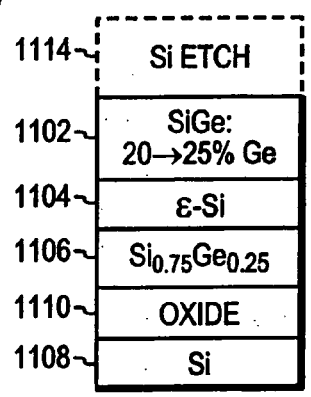
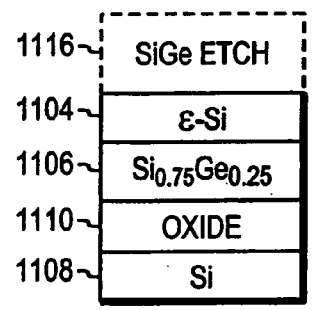
FIG. 11D      FIG. 11E      FIG. 11F

ETCH STOP LAYER SYSTEM

This application is a continuation application of Ser. No. 09/599,260 filed Jun. 22, 2000, now U.S. Pat. No. 6,689,211, which is a continuation-in-part application of Ser. No. 09/289,514 filed Apr. 9, 1999, now U.S. Pat. No. 6,521,041, which claims priority from provisional application Ser. No. 60/081,301 filed Apr. 10, 1998.

BACKGROUND OF THE INVENTION

The invention relates to the field of etch-stop material systems on monocrystalline silicon.

Microelectromechanical systems (MEMS) form the bridge between conventional microelectronics and the physical world. They serve the entire spectrum of possible applications. MEMS include such varied devices as sensors, actuators, chemical reactors, drug delivery systems, turbines, and display technologies. At the heart of any MEMS is a physical structure (a membrane, cantilever beam, bridge, arm, channel, or grating) that is "micromachined" from silicon or some other electronic material. Since MEMS are of about the same size scale and, ideally, fully integrated with associated microelectronics, naturally they should capitalize on the same materials, processes, equipment, and technologies as those of the microelectronics industry. Because the process technology for silicon is already extensively developed for VLSI electronics, silicon is the dominant material for micromachining. Silicon is also mechanically superior to compound semiconductor materials and, by far, no other electronic material has been as thoroughly studied.

A wide array of micromachined silicon devices are fabricated using a high boron concentration "etch-stop" layer in combination with anisotropic wet etchants such as ethylenediamine and pyrocatechol aqueous solution (EDP), potassium hydroxide aqueous solution (KOH), or hydrazine ($N_2H_2$). Etch selectivity is defined as the preferential etching of one material faster than another and quantified as the ratio of the faster rate to the slower rate. Selectivity is realized for boron levels above $10^{19}$ cm$^{-3}$, and improves as boron content increases.

It should be noted that etch stops are also used in bond and etch-back silicon on insulator (BESOI) processing for SOI microelectronics. The etch-stop requirements differ somewhat from those of micromachining, e.g., physical dimensions and defects, but the fundamentals are the same. Hence, learning and development in one area of application can and should be leveraged in the other. In particular, advances in relaxed SiGe alloys as substrates for high speed electronics suggests that a bond-and-etch scheme for creating SiGe-on-insulator would be a desirable process for creating high speed and wireless communications systems.

SUMMARY OF THE INVENTION

Accordingly, the invention provides a SiGe monocrystalline etch-stop material system on a monocrystalline silicon substrate. The etch-stop material system can vary in exact composition, but is a doped or undoped $Si_{1-x}Ge_x$ alloy with x generally between 0.2 and 0.5. Across its thickness, the etch-stop material itself is uniform in composition. The etch stop is used for micromachining by aqueous anisotropic etchants of silicon such as potassium hydroxide, sodium hydroxide, lithium hydroxide, ethylenediamine/pyrocatechol/pyrazine (EDP), TMAH, and hydrazine. For example, a cantilever can be made of this etch-stop material system, then released from its substrate and surrounding material, i.e., "micromachined", by exposure to one of these etchants. These solutions generally etch any silicon containing less than $7 \times 10^{19}$ cm$^{-3}$ of boron or undoped $Si_{1-x}Ge_x$ alloys with x less than approximately 18.

Alloying silicon with moderate concentrations of germanium leads to excellent etch selectivities, i.e., differences in etch rate versus pure undoped silicon. This is attributed to the change in energy band structure by the addition of germanium. Furthermore, the nondegenerate doping in the $Si_{1-x}Ge_x$ alloy should not affect the etch-stop behavior.

The etch-stop of the invention includes the use of a graded-composition buffer between the silicon substrate and the SiGe etch-stop material. Nominally, the buffer has a linearly-changing composition with respect to thickness, from pure silicon at the substrate/buffer interface to a composition of germanium, and dopant if also present, at the buffer/etch-stop interface which can still be etched at an appreciable rate. Here, there is a strategic jump in germanium and concentration from the buffer side of the interface to the etch-stop material, such that the etch-stop layer is considerably more resistant to the etchant.

In accordance with the invention there is provided a monocrystalline etch-stop layer system for use on a monocrystaliine Si substrate. In one embodiment of the invention, the system includes a substantially relaxed graded layer of $Si_{1-x}Ge_x$, and a uniform etch-stop layer of substantially relaxed $Si_{1-y}Ge_y$. In another embodiment of the invention, the system includes a substantially relaxed graded layer of $Si_{1-x}Ge_x$, a uniform etch-stop layer of substantially relaxed $Si_{1-y}Ge_y$, and a strained $Si_{1-x}Ge_x$ layer. In yet another embodiment of the invention, the system includes a substantially relaxed graded layer of $Si_{1-x}Ge_x$, a uniform etch-stop layer of substantially relaxed $Si_{1-y}Ge_y$, a second etch-stop layer of strained $Si_{1-z}Ge_z$, and a substantially relaxed $Si_{1-w}Ge_w$ layer.

In accordance with the invention there is also provided a method of integrating device or layer. The method includes depositing a substantially relaxed graded layer of $Si_{1-x}Ge_x$ on a Si substrate; depositing a uniform etch-stop layer of substantially relaxed $Si_{1-y}Ge_y$ on the graded buffer; and etching portions of the substrate and the graded buffer in order to release the etch-stop layer.

In accordance with another embodiment of the invention, there is provided a method of integrating a device or layer. The method includes depositing a substantially relaxed graded layer of $Si_{1-x}Ge_x$ on a Si substrate; depositing a uniform first etch-stop layer of substantially relaxed $Si_{1-y}Ge_y$ on the graded buffer; depositing a second etch-stop layer of strained $Si_{1-z}Ge_z$; depositing a substantially relaxed $Si_{1-w}Ge_w$ layer; etching portions of the substrate and the graded buffer in order to release the first etch-stop layer; and etching portions of the residual graded buffer in order to release the second etch-stop $Si_{1-z}Ge_z$ layer.

BRIEF DESCRIPTION OF THE DRAWINGS

FIGS. 11A-11F are schematic diagrams of the fabrication process for SiGeOI;

DETAILED DESCRIPTION OF THE INVENTION

Figure 1A:
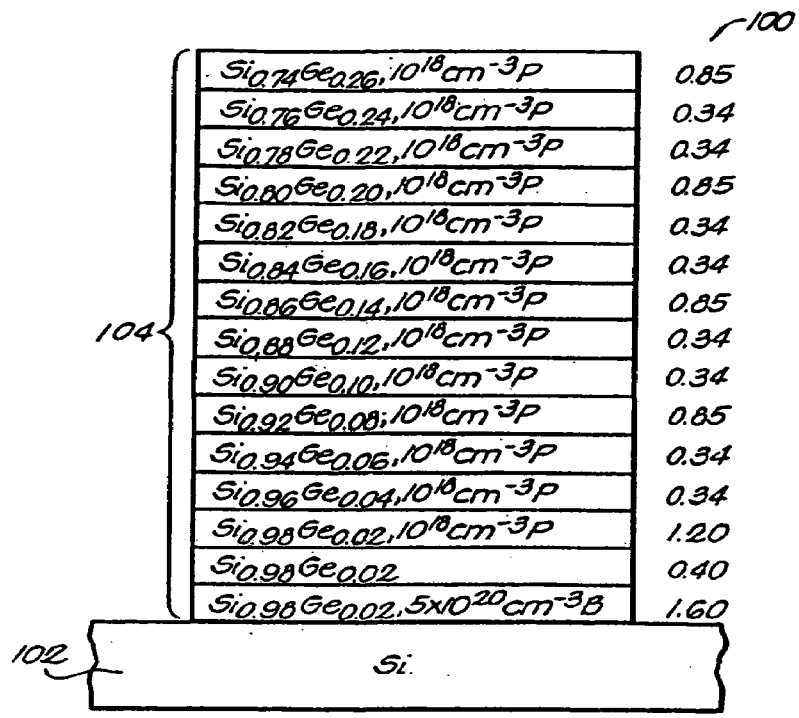
FIGS. 1A-1D are functional block diagrams of exemplary epitaxial SiGe etch stop structures configured on a silicon substrate in accordance with the invention.

In the traditional method of forming etch stops in Si micromachining or in certain SOI processes, good etch-stop results are only obtained at very high concentrations of boron, and the dopant's effect on the silicon crystal structure becomes vitally important. Substitution of a silicon atom site with boron, a smaller atom than silicon, contracts the silicon lattice. As the doped lattice remains coherent with the lattice of the undoped substrate, a biaxial "lattice mismatch" stress is generated in the plane of the substrate. This stress biaxially elongates, i.e., elastically strains, the doped material in the same plane. As the base of a unit cell is strained, so is the height via Poisson distortion. Therefore, the Si:B lattice is vertically contracted as it is horizontally expanded, leading to a smaller vertical lattice constant than the equilibrium value. For thin layers of Si:B, it is energetically favorable for the material to be elastically strained like this, i.e., "pseudomorphic".

As the thickness of the doped layer grows, however, the total strain energy per unit area of film increases proportionally, until the layer surpasses a "critical thickness" when it is energetically favorable to introduce dislocations instead of elastically straining the film. Dislocation loops are heterogeneously nucleated at the film surface or film edges and grow larger, gliding towards the substrate-film interface. When a loop meets the interface, the two ends (now called "threading" dislocations because they traverse the thickness of the film) continue to travel away from each other, trailing a line defect at the interface known as a "misfit" dislocation. The misfit dislocations accommodate the lattice-mismatch stress, relieving the horizontal and vertical strains and restoring the in-plane and perpendicular lattice constants to the equilibrium value, i.e., "relaxing" the material. For a low-mismatched lightly strained epitaxial film on a diamond cubic or zincblende substrate, a mesh of orthogonal <110> misfit dislocations is the most likely configuration because of the {111}<110> easy slip system for these crystal structures at elevated temperatures, such as those involved in diffusion and most CVD processes.

At high enough quantities, the effects of any dissimilar-sized substitutional atom on the silicon microstructure are the same as those of boron. Of course, the impact depends on the relative size and concentration of the substitutional species. Also, incorporation of a larger atom than silicon, e.g., germanium, would result in compressive stress and strain rather than a tensile situation like Si:B.

In the conventional etch stop process, extremely high concentrations of boron are needed to achieve a high etch rate selectivity. These very high boron concentrations lead to dislocation introduction in the thick films that are desired in many MEMS applications. Since the p++ process is created usually through a diffusion process, there is a gradient in dislocation density and a gradient in the boron concentration. Because the etch stops in the boron concentration gradient, the thin film part typically possesses large curvature, which is compensated for by an annealing treatment. In addition, the etch stop selectivity is extremely sensitive to the boron concentration. If the concentration falls below the critical $7 \times 10^{19}$ $cm^{-3}$, the selectivity is drastically different. Thus, since this boron concentration is near the solubility limit, dopant concentration fluctuations in the vertical and lateral dimensions produce low yields in MEMS processes. The SiGe etch stop breaks the link between dopant concentration and etch selectivity. Also, since the SiGe alloy is a miscible alloy system, there is continuous complete solubility between Si and Ge.

The theory of anisotropic etching of silicon as described by Seidel et al., J. Electrochem. Soc. 137, pp. 3626-31 (1990), incorporated herein by reference, is widely considered the appropriate model. Although specifics like absolute etch rate and dissolution products may differ, the general concept is valid for all anisotropic etchants, as they are all aqueous alkaline solutions and the contribution of the etchant is modeled as nothing more specific than $H_2O$ and $OH^-$. Indeed, the existing literature shows consistent behavior among the etchants.

Early work on etch rate reduction in p++ Si:B presented no hypotheses beyond empirical data. Two possible explanations for the etch-stop phenomenon were proposed: stronger bonding from the high boron concentration or the formation of a boron-based passivation layer. As research accumulated, the etch-stop theories aligned along two credible approaches. The electronic models assign etch-stop behavior to the action of carriers while the passivation models directly attribute it to the formation of a passivating oxide-based layer on the silicon surface.

Others concluded that the etch-rate decrease is sensitive to hole concentration and not to atomic concentration of boron or stress. They observed an etch rate drop that was proportional to the fourth power of the increase in boron concentration beyond about $3 \times 10^{19}$ $cm^{-3}$. Four electrons are required by a red-ox etching process they described, leading them to explain the etch-stop effect in p++ material as an increased probability that the electrons are lost to Auger recombination because of the higher hole concentrations.

Seidel et al. agreed with the electron recombination hypothesis. They saw the etch rate begin to fall around $2\text{-}3 \times 10^{19}$ $cm^{-3}$, which agrees with the doping level for the onset of degeneracy, $2.2 \times 10^{19}$ $cm^{-3}$. At degeneracy, the Fermi level drops into the valence band and the band-bending is confined to a thickness on the order of one atomic layer. The injected electrons needed for etching are able to tunnel through such a narrow potential well and recombine in the p++ bulk crystal, which halts the etching reaction. The remnant etch rate in the etch-stop regime is attributed to the conduction band electrons, whose quantity is inversely proportional to the hole, i.e. boron, concentration. Four electrons are required to etch one silicon atom, which explains the dependence of the remnant etch rate on the fourth power of the boron concentration.

It was observed that the formation of an $SiO_x$ passivation layer on p++ $Si:B(2\times10^{20}$ $cm^{-3})$ in aqueous KOH by in situ ellipsometric measurements. In the case of $p^+$—Si, a large number of holes at the surface causes spontaneous passivation with a thin oxide-like layer. The layer is not completely networked like thermal oxide, so it is etched faster and there is still transport of reactants and etch products across the layer, leading to some finite overall etch rate. The lattice strain induced by a high dopant concentration could enhance the layer's growth. Furthermore, the etch rate reduction is not a Fermi-level effect since the phenomenon is exhibited by both heavily doped p- and n-silicon.

Chen et al., J. Electrochem. Soc. 142, p. 172 (1995), assimilated the observations and hypotheses above and their own findings into a composite electrochemical model, where etch stopping is attributed to the enhancement of the oxide film growth rate under high carrier concentration. The key process is hole-driven oxidation at the interface, which inhibits etching by competing with a reaction for Si—Si bonds and hydroxyl radicals, but more importantly, by building the $SiO_x$ barrier. In p++ silicon, a sufficient quantity of holes for etch-stop behavior is supplied as the converse of the electron action outlined by Seidel et al. That is, instead of electrons thermally escaping the potential well or tunneling through into the bulk crystal, holes from the bulk crystal thermally overcome or tunnel through the potential barrier to the interface. It will be appreciated that this etch-stop process is dynamic, i.e., it is a continuous competition of silicon dissolution and formation/dissolution of the oxide-like layer, whose net result is a nonzero etch rate.

Germanium is appealing as an etch-resistant additive because it is isoelectronic to, and perfectly miscible in, silicon and diffuses much less readily than dopants and impurities in silicon. Furthermore, the epitaxy of silicon-germanium alloys is selective with respect to silicon oxide, facilitating patterning and structuring, and even affords higher carrier mobilities to electronics monolithically integrated with MEMS.

Existing germanium-based etch-stop systems are, at best, only marginally suitable for silicon micromachining. In spite of the aforementioned advantages to using germanium, currently there is an inadequate understanding of the etch-stop effect in silicon-germanium materials and no information on anisotropic etching of high germanium content solid solutions.

Many isotropic etchants for pure germanium exist. Common to all of these is an oxidizer, such as $HNO_3$ or $H_2O_2$, and a complexing agent to remove the oxide, like HF or $H_3PO_4$. Early studies were made on isotropic germanium etching by solutions such as "Superoxol", a commercially available $H_2O_2$—HF recipe. More recently, investigations have been made on various combinations of $HNO_3$, $HNO_2$, HF, $H_2SO_4$, $H_2SO_2$, $CH_3COOH$, $H_2O_2$, and $H_2O$.

In fact, some of these compositions selectively etch germanium or silicon-germanium alloys over silicon, because of differences in the relative oxidation or oxide dissolution rates, but only one etchant exhibits the inverse preference relevant to this project: 100% $NH_4OH$ at 75° C. directly attacks polysilicon at 2.5 µm/hr but polygermanium at only 660 Å/hr. Unfortunately, the selectivity is only about 37, the etch rate for silicon is impracticably slow, and the etch is isotropic, which limits its usefulness in micromachining.

Previous results with heavy concentrations of germanium in silicon are likewise discouraging with respect to silicon micromachining. Shang et al., J. Electrochem. Soc. 141, p. 507 (1994), incorporated herein by reference, obtained a selectivity of 6 for relaxed, dislocated $Si_{0.7}Ge_{0.3}:B$ ($10^{19}$ $cm^{-3}$) in a KOH-propanol-$K_2Cr_2O_7$ aqueous solution. Yi et al., Mat. Res. Soc. Symp. Proc. 3779, p. 91 (1995), developed a novel $NH_4NO_3$—$NH_4OH$ etchant with selectivities better than 1000 at 70° C. for 10% and higher germanium alloys. The mixture does not etch pure germanium, but etches pure silicon at 5.67 µm/hr, a weak pace for micromachining purposes. Both systems are isotropic.

By holding the $Si_{0.7}Ge_{0.3}:B$ film under the critical thickness, Shang's team improved the selectivity in the same KOH-propanol-$K_2Cr_2O_7$ solution to about 40. Narozny et al., IEEE IEDM (1988) 563, were the first to use such a "strain-selective" recipe, but only realized a selectivity of 20 (for 30% germanium doped with $10^{18}$ $cm^{-3}$ boron) and a sluggish etch rate of 1.5 µm/hr at room temperature for pure silicon.[26] Although the results of Shang et al. and Narozny et al. might have simply been from the well-established etch-stop ability of boron, Godbey et al., Appl. Phys. Lett. 56, p. 374 (1990), achieved a selectivity of 17 with undoped $Si_{0.7}Ge_{0.3}$. None of the articles on strain-selective etchants offer an explanation for the selectivity.

The anemic etch rate is a grave disadvantage because many MEMS structures can be fairly large compared to typical VLSI dimensions. Moreover, MEMS structures subjected to strain-selective etchants would have to be thinner than the critical thickness. However, as a pseudomorphic structure is released and its strain relieved, the selectivity would deteriorate. A sacrificial strained etch-stop layer could be used, imposing additional process steps and design constraints, but would at least provide advantages over current oxide/nitride sacrificial layers: monocrystallinity can continue above the layer and silicon-germanium's growth selectivity with respect to oxide adds design/patterning freedom.

The consensus of the research community has been that low concentrations of germanium have little or no effect on etch stopping in anisotropic etchants like KOH and EDP. Up to 12% germanium, Seidel et al. detected no significant suppression of etch rate. p++ layers strain-compensated with 2% germanium showed no remarkable differences from those without germanium. By implanting germanium, Feijóo et al., J. Electrochem. Soc.: 139, pp. 2312-13 (1992), attained a maximum selectivity of 12 to 24 in EDP at 80° C., corresponding to a dose with a peak concentration of about 0.6%.

Finne et al., J. Electrochem. Soc. 114, p. 969 (1967), however, observed that $Si_{1-x}Ge_x$ solid solutions with x as small as 0.05 did not etch in an ethylenediamine-pyrocatechol-water (EPW) solution. This discrepancy may be attributed to the use of {111} wafers, where accurate measurements are difficult because etching in the <111> direction is very slow. No other information has been reported on germanium-rich alloys in anisotropic media.

Corresponding to the ostensible ineffectiveness of germanium as an etch-stop agent in most publications, there has been little discussion of the source of the limited selectivity that has been detected. Seidel et al. cautioned that their model for heavily-doped boron etch stops is not applicable to germanium because the element is isoelectronic to silicon. They assumed instead that the small reduction of the etch rate is either due to changes in the energy band structure, or else a consequence of the extremely high concentration of lattice defects such as misfit dislocations which could act as recombination centers.

The invention provides a SiGe monocrystalline etch-stop material system on a monocrystalline silicon substrate. The etch-stop material system can vary in exact composition, but is a doped or undoped $Si_{1-x}Ge_x$ alloy with x generally between 0.2 and 0.5. Across its thickness, the etch-stop material itself is uniform in composition. The etch stop is used for micromachining by aqueous anisotropic etchants of silicon such as potassium hydroxide, sodium hydroxide, lithium hydroxide, ethylenediamine/pyrocatechol/pyrazine (EDP), TMAH, and hydrazine. For example, a cantilever can be made of this etch-stop material system, then released from its substrate and surrounding material, i.e., "micromachined", by exposure to one of these etchants. These solutions generally etch any silicon containing less than $7 \times 10^{19}$ $cm^{-3}$ of boron or undoped $Si_{1-x}Ge_x$ alloys with x less than approximately 0.18.

Thus, it has been determined that alloying silicon with moderate concentrations of germanium leads to excellent etch selectivities, i.e., differences in etch rate versus pure undoped silicon. This is attributed to the change in energy band structure by the addition of germanium. Furthermore, the nondegenerate doping in the $Si_{1-x}Ge_x$ alloy should not affect the etch-stop behavior.

The etch-stop of the invention includes the use of a graded-composition buffer between the silicon substrate and the SiGe etch-stop material. Nominally, the buffer has a linearly-changing composition with respect to thickness, from pure silicon at the substrate/buffer interface to a composition of germanium, and dopant if also present, at the buffer/etch-stop interface which can still be etched at an appreciable rate. Here, there is a strategic jump in germanium and concentration from the buffer side of the interface to the etch-stop material, such that the etch-stop layer is considerably more resistant to the etchant. For example, the buffer could grade up to $Si_{0.5}Ge_{0.15}$, then jump to a uniform etch-stop layer of $Si_{0.7}Ge_{0.3}$. Nominally, the composition gradient in the buffer is 5-10% Ge/micron, and the jump in Ge concentration is 5-15 relative atomic percent Ge. The buffer and etch-stop materials are deposited epitaxially on a standard silicon substrate, such as by chemical vapor deposition-(CVD) or molecular beam epitaxy (MBE). Note in the above example that the germanium concentration leads to etch stop behavior, and therefore doping concentrations in the etch stop can be varied independently, without affecting etch selectivity.

With respect to the effect of crystalline defects on the etch-stop behavior, in accordance with the invention using $Si_{1-x}Ge_x$ alloys, the influence of defects is minimal. The use of a graded buffer suppresses the threading dislocation density (TDD) in the top etch-stop layer, which leads to a uniform, nearly defect-free $Si_{1-x}Ge_x$ etch stop.

The significance of the jump in concentration(s) at the end of the graded region is that the part must be well defined and dimensions well controlled. Thus, a high selectivity should exist between the top etch-stop layer and the end of the graded region for abrupt, predictable etch-stop behavior. A smooth compositional transition from buffer to etch-stop layer would lead to curved edges and greater dimensional variability in the micromachined part, whereas compositional jumps would yield clean, sharp edges and precise dimensions in the released structure. However, if the jump is too large, e.g., greater than ~20-25 atomic % Ge, the corresponding change in lattice constant, i.e., the lattice mismatch, would create defects.

The $Si_{1-x}Ge_x$; etch-stop material system, which can be substituted for heavily boron-diffused layers, broadens the spectrum of available etch-stop materials, including undoped (isoelectronic) materials, thus improving the design flexibility for micromachined structures. For example, standard micromachining processes limit the dimensions of silicon sensor structures to a single uniform thickness. Resonant devices for inertial sensing would benefit considerably from more flexible design in which the resonators are thinner than the seismic mass. The invention provides an enabling technology for such a multi-thickness structure. Such a fundamental advantage makes the novel technology widely applicable to the fabrication of MEMS by silicon micromachining.

A tremendously significant application is the ability to integrate mechanical and electronic devices on the same material. Replacement of the heavily boron-doped etch stop, which is incompatible with integrated circuit (IC) requirements, by isoelectronic and/or moderately-doped etch stops of device quality allows concurrent processing of mechanical devices and associated electronics on the same wafer. Germanium is perfectly miscible in silicon and diffuses much less readily than dopants and impurities. Alloying with germanium also affords higher carrier mobilities to the electronic devices.

Furthermore, epitaxy of $Si_{1-x}Ge_x$, alloys is selective with respective to silicon oxide, which facilitates patterning and structuring. In addition, defects do not seem to affect the etch-stop efficacy of these materials.

In developing the germanium-based etch stops of the invention, standard 3" or 4" phosphorous-doped (2-4 $\Omega \cdot cm$) or boron-doped (7-10.2 $\Omega \cdot cm$) (001) silicon substrates were used. The wafers were cleaned for 10 minutes in a piranha bath (3:1 95% $H_2SO_4$ in water: 30% $H_2O_2$ in water) and 10 seconds in 4.4% HF and DI water. The substrates were then left in the load lock (~$10^{-8}$ Torr) of the vertical UHVCVD reactor overnight. On the following day, the substrates were raised to the lip of the reactor chamber for about two hours to drive off any volatiles, organics, and water. Then the wafers were desorbed of whatever oxide remained by raising them into the 850-900° C. reactor chamber for several minutes. A silicon buffer layer on the order of 1 μm was deposited with $SiH_4$ while the reactor was brought to process temperature. Following this preparation procedure each time, the epitaxial structures were grown in the temperature range 750-900° C. using $SiH_4$, $GeH_4$, 1% $B_2H_6$ in $H_2$, and 1% $PH_3$ in $H_2$.

KOH and EDP were used in the etching. KOH is a commonly studied etchant, the simplest and easiest to consider, and relatively easy and safe to use. Although details of absolute etch rate differ, various anisotropic silicon etchants have behaved consistently. Seidel et al.'s well-subscribed theory of anisotropic etching is explicitly etchant-nonspecific. Results, discussions, and conclusions regarding anisotropic etching and etch-stopping of silicon are widely considered to be valid for any anisotropic etchant. Cylindrical etching and patterned oxide masks were both used to determine the efficacy of Ge concentration on etch rate.

To test the utility of the relaxed epitaxial SiGe etch stops, epitaxial structures were fabricated: WU_2, WU_3, WU_4, and UHV_17 as shown in FIGS. 1A-1D. FIG. 1A is a functional block diagram of an epitaxial SiGe etch stop structure 100 (WU_2) configured on a silicon substrate 102.

The structure includes a plurality of relaxed graded layers 104 that vary from $Si_{0.98}Ge_{0.02}$, $5\times10^{20}$ cm$^{-1}$ B at the substrate surface, to the top surface layer of $Si_{0.74}Ge_{0.26}$, $10^{18}$ cm$^{-3}$ P. The thickness of each layer are provided in µm.

Figure 1B:
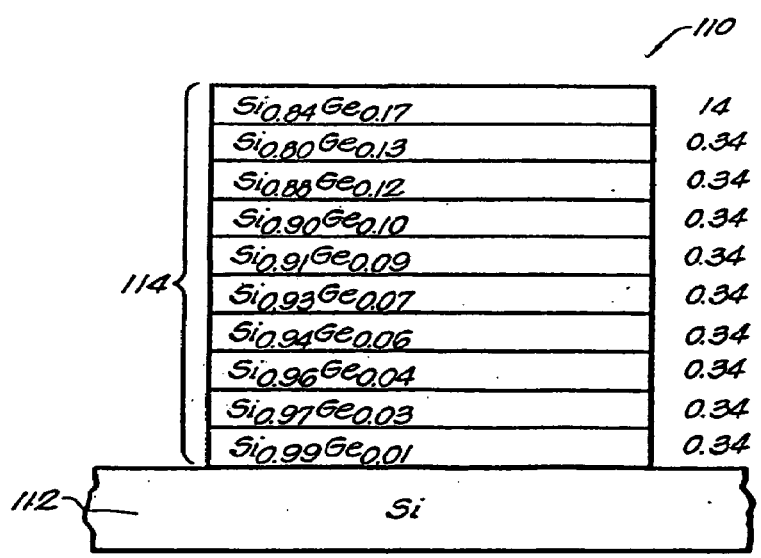

FIG. 1B is a functional block diagram of an epitaxial SiGe etch stop structure 110 (WU_3) configured on a silicon substrate 112. The structure includes a plurality of relaxed graded layers 114 that vary from $Si_{0.99}Ge_{0.01}$ at the substrate surface, to the top surface layer of $Si_{0.84}Ge_{0.16}$.

Figure 1C:
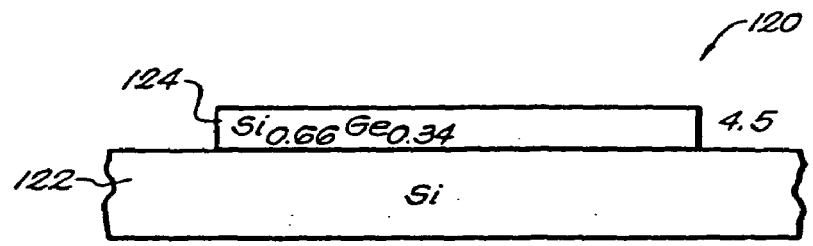

FIG. 1C is a functional block diagram of an epitaxial SiGe etch stop structure 120 (WU_4) configured on a silicon substrate 122. The structure includes a relaxed graded layer 124 of $Si_{0.66}Ge_{0.34}$.

Figure 1D:
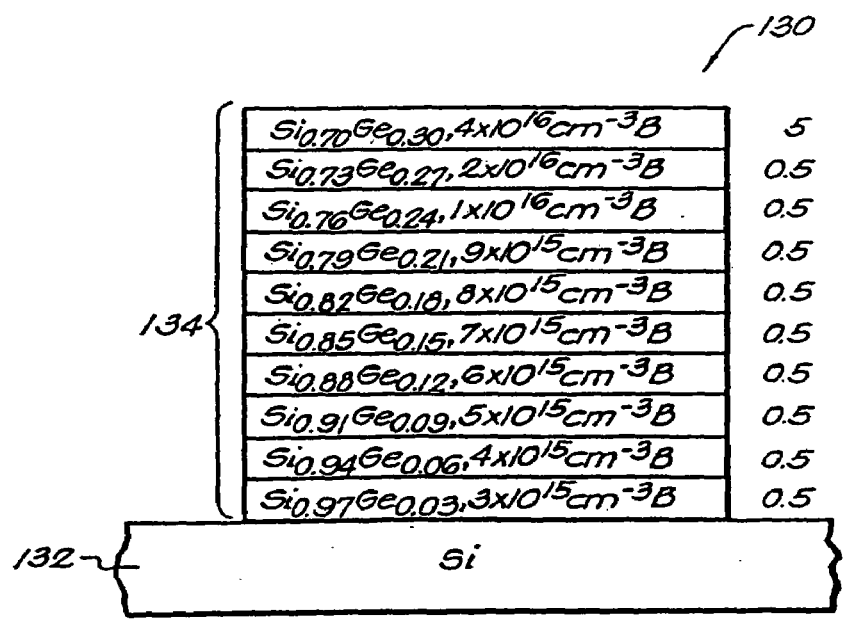

FIG. 1D is a functional block diagram of an epitaxial SiGe etch stop structure 130 (WU_4) configured on a silicon substrate 132. The structure includes a plurality of relaxed graded layers 134 that vary from $Si_{0.97}Ge_{0.03}$, $3\times10^{15}$ cm$^{-3}$ B at the substrate surface, to the top surface layer of $Si_{0.66}Ge_{0.34}$, $4\times10^{16}$ cm$^{-3}$ B.

The compositional grading is known to considerably relax the superficial epitaxial layer while effectively suppressing the TDD. The slow grading rate and generous thickness of these epistructures assure a well-relaxed top film. Thus, the graded buffer enables etching experiments on relaxed, high quality, high germanium content alloys, an etching regime that has never been accessible before. As discussed heretofore, prior research dealt with pseudomorphic $Si_{1-x}Ge_x$ layers or low concentrations of germanium to minimize dislocations, or heavy germanium alloys saturated with threading dislocations. Hence, the grading technique permits one to use the intrinsic etch-stop properties of $Si_{1-x}Ge_x$ solid solutions.

Figure 2:
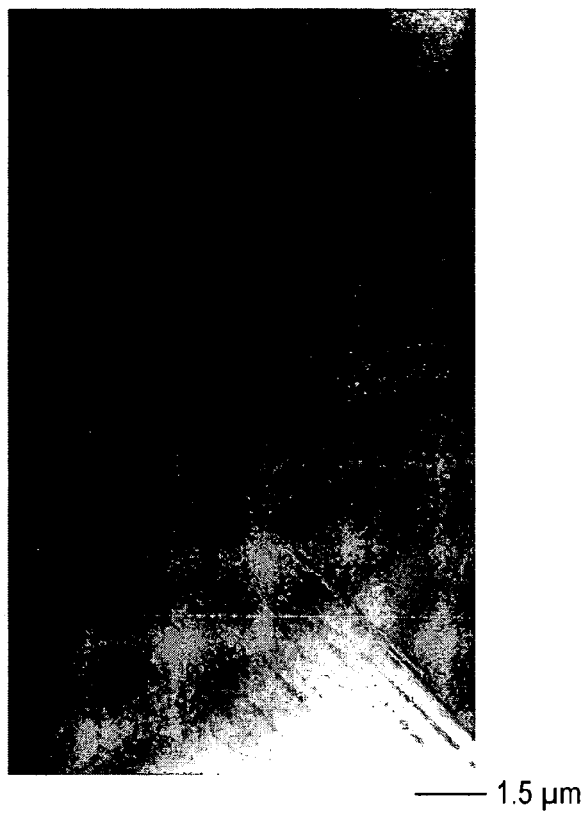
FIG. 2 is a cross-sectional TEM micrograph of the structure of FIG. 1B.

Based on the approximate volume of a cross-sectional TEM sample, a single threading dislocation in a TEM sample represents a TDD of about $10^8$ cm$^{-2}$. FIG. 2 is a cross-sectional TEM micrograph of structure 110 (WU_3). The top surface is in the upper right direction. The parallel lines (misfit dislocations) define the graded buffer. No threading dislocations can be found, which confirms high crystalline quality. The blurred vertical bands are "bend contours", an artifact of TEM, not threading dislocations.

Figure 3:
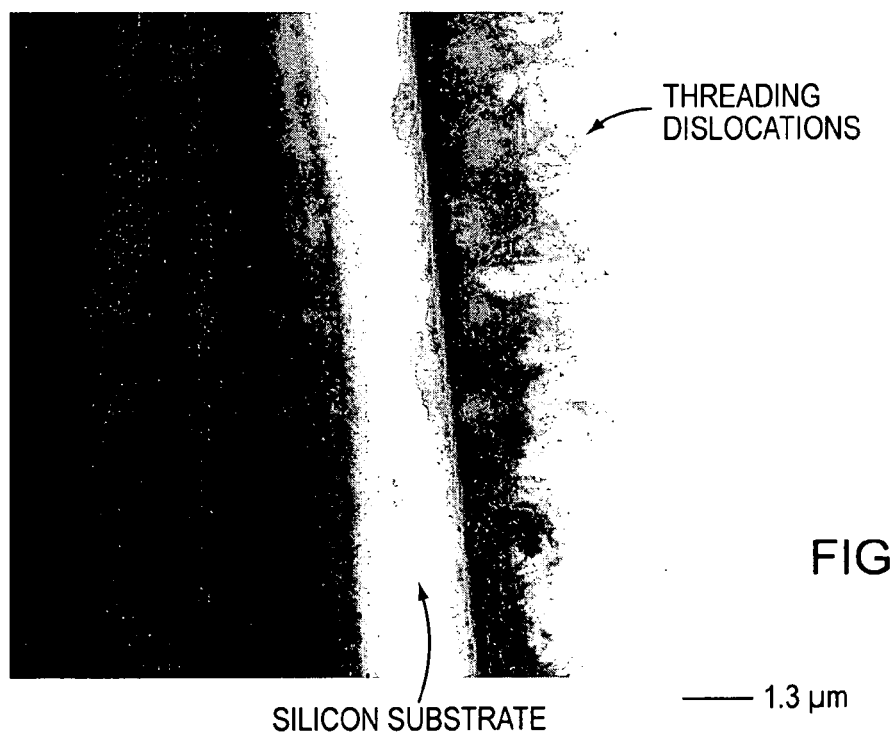
FIG. 3 is a cross-sectional TEM micrograph of the structure of FIG. 1C.

The absence of threading dislocations in FIG. 2 confirms that structures 110 (WU_2), 120 (WU_3), and 130 (UHV_17), which were processed in virtually identical fashion, contain very few defects. TDDs in such relaxed, graded structures have been shown to be in the range of $10^5$-$10^6$ cm$^{-2}$. By omitting the graded buffer, structure 120 (WU_4) was intentionally processed to be significantly imperfect, as verified by FIG. 3. FIG. 3 is a cross-sectional TEM micrograph of structure 120 (WU_4). The top surface is to the right. In contrast to FIG. 2, this film is saturated with threading dislocations, which confirms poor crystalline quality. The misfit dislocations in all four of these samples are buried under such a thick overlayer that they cannot possibly affect etching from the top surface.

Figure 4:
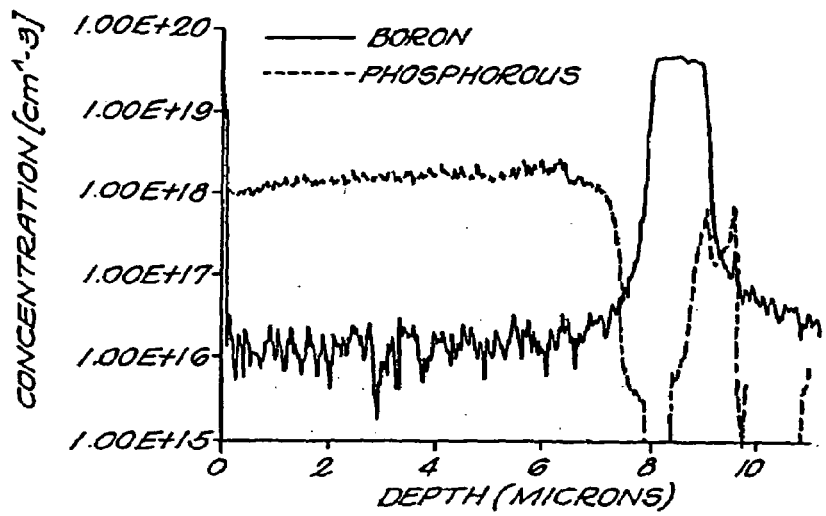
FIG. 4 is graph of dopant concentrations of the structure of FIG. 1A.
Figure 5:
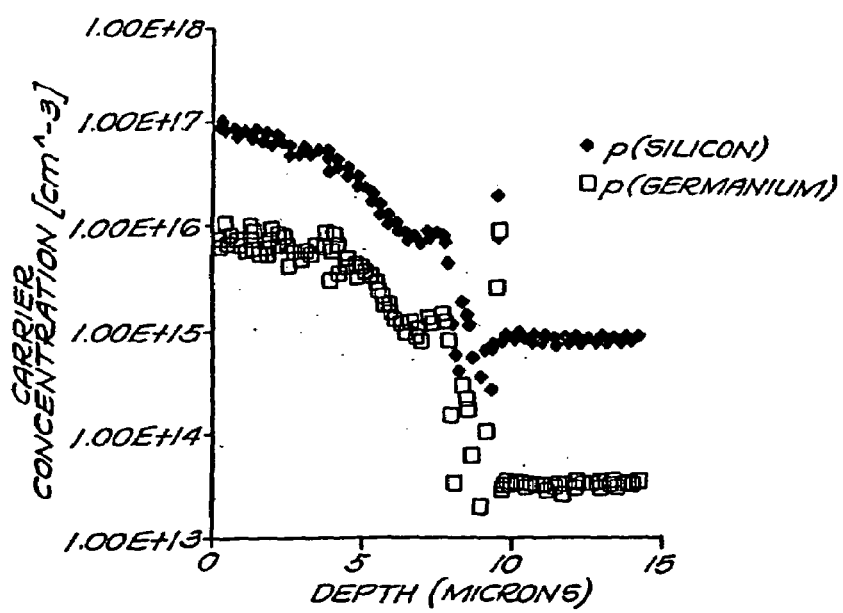
FIG. 5 is a graph of dopant concentrations of the structure of FIG. 1D.

Dopant concentrations of structures 100 (WU_2) and 130 (UHV_17) are shown in the graphs of FIGS. 4 and 5 respectively. The dopant concentrations were calculated from the mobilities of pure silicon and pure germanium, as indicated. Since structure 130 (UHV_17) contains 30% germanium, the true boron content lies somewhere in between, closer to the pure silicon line. Regardless, it is clear that the boron doping does not approach the levels needed for etch stopping. Structure 130 was doped p-type to investigate potential interactions or synergies with germanium that were suppressed in structure 100 by intentional background n-doping.

The characteristics of these materials (top layer) that are relevant to etching are summarized in the following table.

| sample | avg % Ge (EDX) | doping [cm$^{-3}$] | defect density (TEM) |
|---|---|---|---|
| WU_2 | 26 | $10^{18}$ P (SIMS) | Low |
| WU_3 | 17 | None | Low |
| WU_4 | 34 | None | High |
| UHV_17 | 30 | $4\times10^{16}$ B (SRP) | Low |

Structure 100 (WU_2) was used to identify the critical germanium concentration by cylindrically etching and to obtain etch rate values by etching from the top surface.

Figure 6A:
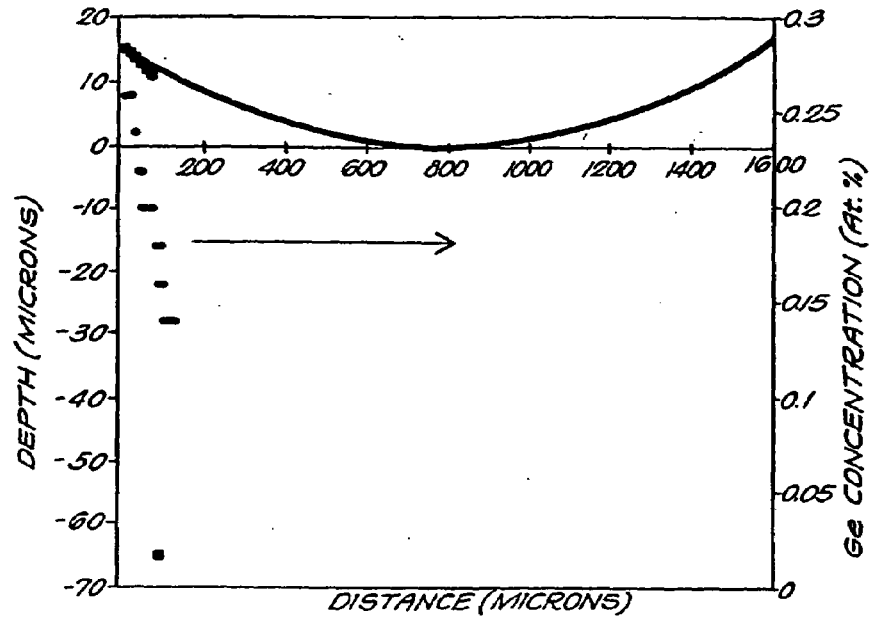
FIG. 6A is a graph showing the cylindrical etch results of the structure of FIG. 1A.

The cylindrical etch results of structure 100 (WU_2), as shown in the graph of FIG. 6A, confirm the etch-stop behavior of germanium and narrowed the threshold germanium concentration to the range of 16-22%. It was ensured that there were no effects from boron by doping the film n-type. The terraces on the left of the graph, defined by the round dots, represent the layers in the epistructure. The left scale reflects the depth of each layer while the right scale relates the nominal germanium concentration of each layer. The arc is the initial groove surface, and the square dots trace the etched surface.

Figure 6B:
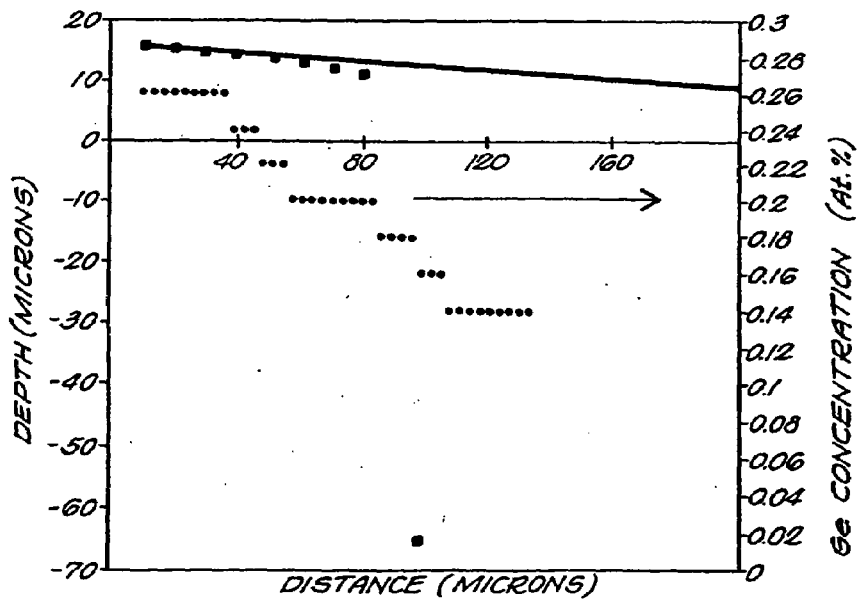
FIG. 6B is graph showing a magnification of the left side of FIG. 6A.

FIG. 6B is a magnification of the left side of FIG. 6A. It is clear that the etch rate increases dramatically somewhere around 18-20% germanium, suggesting that the critical germanium concentration is in that vicinity.

Figure 7:
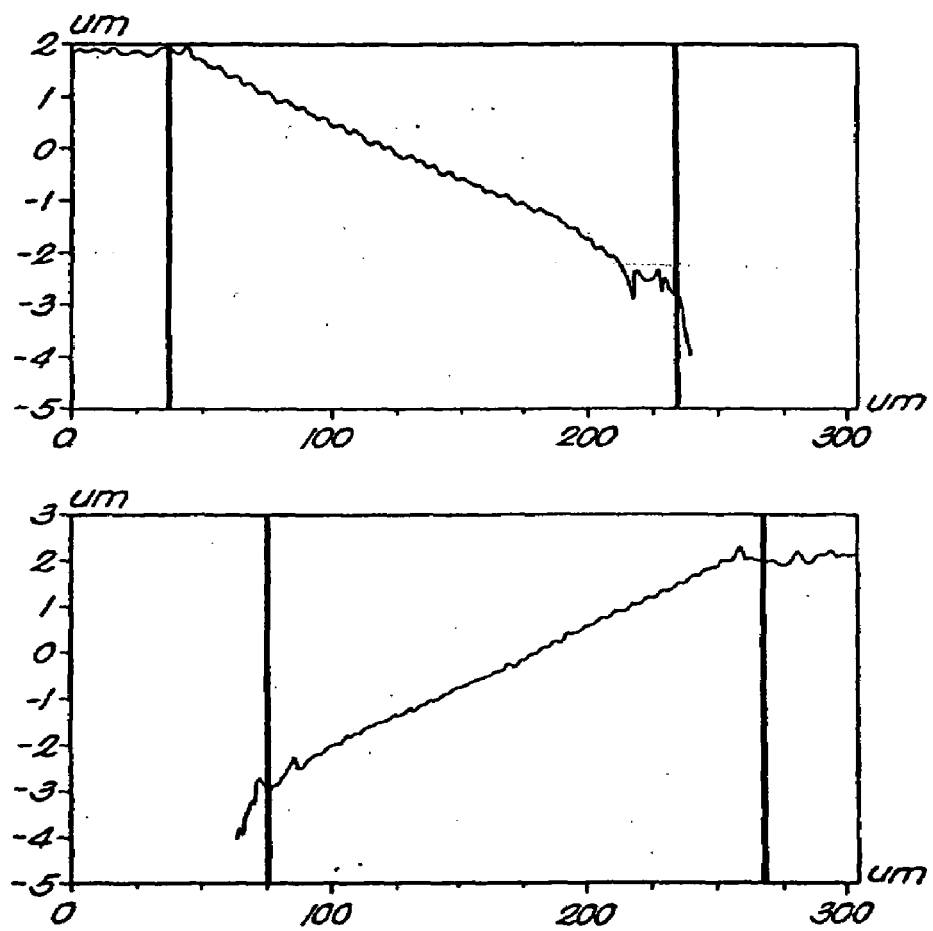
FIG. 7 is a graph showing the cylindrical etch results of the structure of FIG. 1D.

The cylindrical etch results of structure 130 (UHV_17); as shown in the graph of FIG. 7, show the etch accelerating dramatically around 4.8-5 µm depth. The 5% Ge/µm grading rate reasonably assures that the threshold germanium concentration is near 20% germanium. The profiles of each side of the groove are shown. The lower bar marks where the profile begins to deviate from the initial grooved shape. The depth of this point appears to be 4.8-5.0 µm below the top surface.

The results of the etch rate tests using oxide windows are presented in the following table.

| wafer | at % Ge | concentration Ge [cm$^{-3}$] | etch rate [µm/hr] |
|---|---|---|---|
| WU_2 | 25.6 | $1.28\times10^{22}$ | 0.070 |
| WU_3 | 16.9 | $8.45\times10^{21}$ | 0.234 |
| WU_4 | 34.0 | $1.70\times10^{22}$ | 0.040 |
| UHV_17 | 30.0 | $1.50\times10^{22}$ | 0.133 |

The etch rate for <100> intrinsic silicon in 34% KOH at 60° C. was taken as 18.29 µm/hr from Seidel et al. The experimental data for structures 100 (WU_2), 110 (WU_3), 120 (WU_4), and 130 (UHV_17) are shown in the table. Normalized by 18.29 µm/hr, they are plotted in the graph of FIG. 8 along with Seidel et al.'s points.

Figure 8:
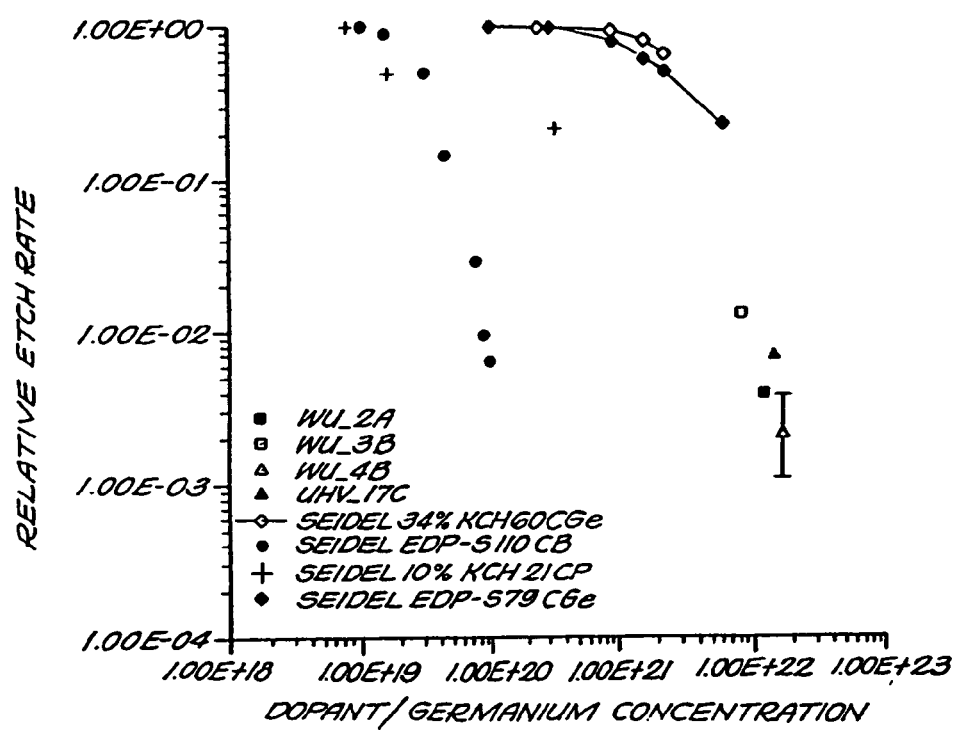
FIG. 8 is a graph showing the etch rates for <100> intrinsic silicon in 34% KOH at 60° C. normalized by 18.29 μm/hr of the structures of FIGS. 1A-1D.

Some features in FIG. 8 should be emphasized. First, there was appreciably greater variability, both up and down, in the individual etch rates of "good" structure 120 (WU_4) pieces than of the other good samples, hence the error bar. A comparison of all the data supports the belief that the considerable surface roughness of structure 120 (WU_4), from lattice-mismatch stress and the high TDD, is probably to blame. Thus, the graded layer has already proven its efficacy since the graded layer samples did not display this problem.

The shape of the new curve very closely resembles that of EDP-boron curve, adding confidence in the new data as well as implying the existence of a universal: etch-stop model. In addition, KOH, a more environmentally friendly etch stop than EDP, appears to be a better etch stop with SiGe alloy than EDP with the conventional p++ etch stop.

Despite the popular sentiment in the literature, it is indisputable that silicon-germanium alloys with sufficient germanium are exceptional etch stops that rival the most heavily boron-doped materials. Three different etching techniques and two etchant systems, KOH and EDP, conclusively show this. The intersection of the steep portion of the KOH-germanium curve with unity relative etch rate, the so-called "critical concentration" as defined by Seidel et al., appears to be $2\times10^{21}$ cm$^{-3}$, i.e., 4%, for germanium. Although this value is about 100 times greater than their "critical concentration" for boron, higher selectivities can theoretically be attained with germanium because there are neither solid solubility nor electrical activity limits.

The substantial selectivities obtained from the well-relaxed, low-defect sample structures 100 (WU_2), 110 (WU_3), and 130 (UHV_17) indicate that strain, induced by defects or dissimilar atomic radii, is not principally responsible for etch-stop behavior.

Defects do not play a central role in etch resistance. The excellent results from WU_2, WU_3, and UHV_17, relaxed materials with low TDDs, controvert the speculation that lattice defects serving as recombination centers cause the etch stop behavior with germanium or isoelectronic additives, respectively. Furthermore, a comparison of the etch rate of structure 120 (WU_4) to the KOH-germanium trendline indicates that even a high TDD does not influence etch stopping dramatically (if at all), nor in a predictable fashion.

The immediately attractive explanation for germanium's newfound etch-stop potency in silicon is the mechanism outlined by R. Leancu, *Sensors and Actuators,* A 46-47 (1995) 35-37, incorporated herein by reference. For 15-30% germanium, it seems more logical to interpolate from the bulk properties of pure germanium than to postulate only how germanium influences the properties of otherwise pure silicon. That is, one should give the germanium atom just as much credit as the silicon atom, since it is no longer a dopant, but rather an alloying species in the truest sense. Thus, the silicon-germanium alloys in question should show a palpable influence from the etching characteristics of pure germanium, which include a slow rate in KOH.

Keeping this simple chemistry approach in mind, a completely miscible binary system like silicon-germanium would display a linear dependence of etch rate versus alloy composition. Even without etch rate data at high germanium concentrations, including pure germanium, FIG. 8 plainly illustrates that such is not the case. Along the same lines, it is unclear why there would be some critical concentration of germanium for an etch-stop effect if the etch rate is simply a consequence of chemical structure, i.e., the proportion of each element. In fact, a nonlinear plot and a critical concentration imply that the etch rate is a function of energy band structure rather than chemical structure.

On a related note, FIG. 8 shows that the germanium-KOH curve is remarkably similar in shape, but not necessarily slope, to the boron-EDP curve, which ascribes its shape to the electronic etch-stop theory. It is difficult to imagine that the germanium-KOH data would just happen to resemble the boron-EDP data, based on a completely different model that warns of no applicability to germanium. That is, it is highly improbable that the true etch-stop mechanism for germanium is entirely unrelated to the true mechanism for boron when the shapes agree so well.

There are reasons to consider an energy band model to account for the etch-stop behavior in silicon-germanium solid solutions. First, the $Si_{1-x}Ge_x$ data resemble the p++ Si:B data, including the critical concentration and power-law dependence of the remnant etch rate, and the p++ Si:B data is explained well by energy band effects. At these quantities, germanium is known to markedly change the band structure of silicon. Furthermore, two possible mechanisms for the etch stop effect of germanium were defects and energy bands. Defect enhanced recombination can be eliminated due to our graded layer approach. Energy band structure is the only other possibility.

Pure bulk germanium has an energy bandgap, $E_g$, of 0.66 eV at room temperature, compared to 1.12 eV for pure bulk silicon. Hence, the addition of germanium to silicon reduces the bandgap: unstrained $Si_{0.7}Ge_{0.3}$, the situation for samples WU_2, WU_3, WU_4, and UHV_17, has an energy gap of approximately 1.04 eV. Germanium also has a smaller electron affinity, $\chi$, than silicon, 4.00 eV versus 4.05 eV. Thus, the incorporation of germanium decreases the electron affinity as well. As germanium is added, the shrinking bandgap and electron affinity reduce the band-bending, the potential well in the conduction band, and the potential barrier in the valence band.

The height of the potential barrier in the valence band, b, is given by:

$$b = (\chi - d) + \frac{1}{2}E_g \qquad [1]$$

for a generic intrinsic semiconductor, where d is the distance of the Fermi level from E=0, the reference vacuum level. It is understood that the bandgap of $Si_{1-x}Ge_x$ does not change perfectly linearly with germanium concentration, but it is not known how electron affinity decreases with increasing germanium content. Nevertheless, if the two functions are approximated as linear, then b is also roughly linearly dependent on germanium concentration.

Adding germanium to intrinsic silicon also increases the amount of equilibrium electrons and holes, $n_i$ and $p_i$, respectively, via the decreasing bandgap:

$$n_i = p_i = (N_c N_v)^{\frac{1}{2}} \exp\left(-\frac{E_g}{2kT}\right) \qquad [2]$$

where $N_c$ and $N_v$ are the effective density of states in the conduction and valence bands, respectively, k is Boltzmann's constant, and T is temperature. To simplify the description, $N_c$ and $N_v$ will be assumed to be constant and equal to the values for pure silicon. Again, if Eg's dependence on germanium concentration is considered linear, then $P_i$ is exponentially related to germanium concentration.

The increased $p_i$ increases the passivation reaction. For the intrinsic situation, it is assumed that the well/barrier is not sharp enough to allow tunneling. This is especially true for $Si_{1-x}Ge_x$, with the shallower barrier. Furthermore, the inversion layer at the surface is n-type. Then the supply of holes to the passivation reaction is h, the amount of holes from the bulk that overcome the potential barrier thermally. Thus, h is a Boltzmann activated process:

$$h = p_i \exp\left(-\frac{b}{kT}\right) \quad [3]$$

Since $p_i$ is exponentially dependent on germanium content while b is linearly related, h is overall exponentially related to germanium concentration. This can easily be seen by substituting expressions [1] and [2] into [3], yielding:

$$h = (N_c N_v)^{\frac{T}{2}} \exp\left(\frac{-E_g - \chi + d}{1T}\right) \quad [4]$$

where $E_g$ and $\chi$ are linearly dependent on germanium content. If a critical hole concentration exists for interrupting the etch process, then a critical germanium concentration will be observed.

The potential barrier in the valence band increases as the Fermi level moves closer to the valence band, but the hole concentration is significantly increased by p-doping. In fact, the two effects exactly offset each other. In the extrinsic case, the equilibrium hole concentration, p, is defined as:

$$p = n_i \exp\left(\frac{\frac{E_g}{2} - E_F}{kT}\right) \quad [5]$$

$E_g/2-E_F$ is precisely the change in b when the material is doped. Then, when expression [5] is substituted for $p_i$ in equation [3], $E_g/2-E_F$ exactly cancels the change in b in expression [3]. Thus, with nondegenerate doping, the value of h never changes from:

$$h = n_i \exp\left(-\frac{b_i}{kT}\right) \quad [6]$$

where $b_i$ is the height of the barrier in the intrinsic material. Thus, a great advantage of the SiGe etch stop is that the etch selectivity depends only on Ge concentration.

Figure 9:
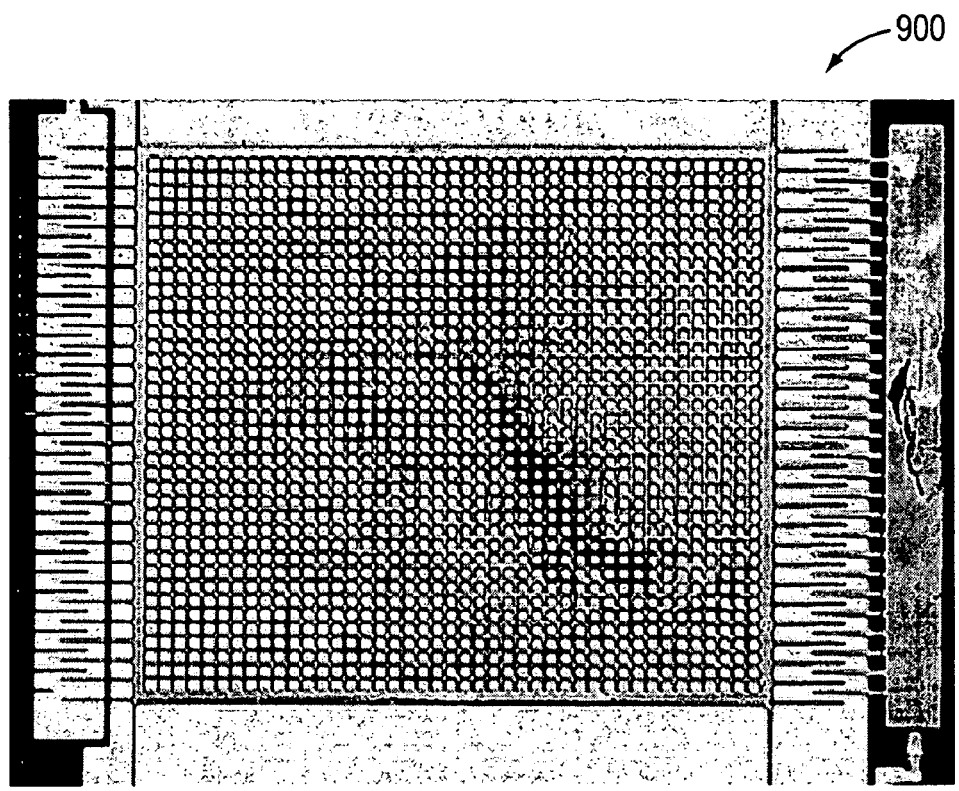
FIG. 9 is a photograph of a top view of a micromachined proof mass.

Test structures of structure 110 (WU_3), completely undoped material, were fabricated and probed. The structure 110 (WU_3) did not provide the 'hardest' etch stop available with SiGe alloys because the germanium concentration (15-17%) was near the concentration when etch stop selectivity starts to decrease. The results were very promising as shown in FIG. 9. FIG. 9 is a photograph of a top view of a micromachined proof mass 900. Even at these low Ge concentrations, etched parts like the proof mass in FIG. 9 are possible. Higher Ge concentrations in the uniform layer (30%) result in extremely hard etch stops, with selectivities approaching 1000:1.

It is apparent from cylindrical and top surface etching with EDP and KOH and actual structures micromachined in EDP that relaxed silicon-germanium alloys with sufficient germanium are exceptional etch stops. Selectivities as high as 1000, corresponding to 34% germanium, have been obtained in KOH for the <100> direction. Neither strain nor defects are responsible for these results. High defect density does not influence the etch rate of $Si_{1-x}Ge_x$; dramatically. A plot of relative etch rate versus germanium concentration follows the same shape as p++ Si:B data, including a critical concentration and a power-law dependence of the remnant rate. The etch stop behavior in relaxed SiGe alloys is correlated to changes in band structure, which are solely connected to Ge concentration.

The extremely high etch selectivities achieved with the SiGe etch stop material system of the invention have immediate applications in forming semiconductor/oxide structures. One method of forming silicon on insulator is to bond a Si wafer to another Si wafer that is coated with silicon dioxide. If one of the wafers is thinned, then a thin layer of Si on silicon dioxide/Si is created. Such structures are useful in low power electronics and high speed electronics since the Si active layer is isolated from a bulk Si substrate via the silicon dioxide layer.

The main disadvantage of this process is the difficulty in thinning one side of the silicon substrate-silicon dioxide-silicon substrate sandwich. In order to have high reproducibility and high yield, the entire wafer must be thinned uniformly and very accurately. Buried etch stops have been used with little success. Even buried, thin layers of strained SiGe have been used, but as mentioned earlier these etch demonstrate etch selectivities <<100, and therefore are not sufficient.

Figure 10:
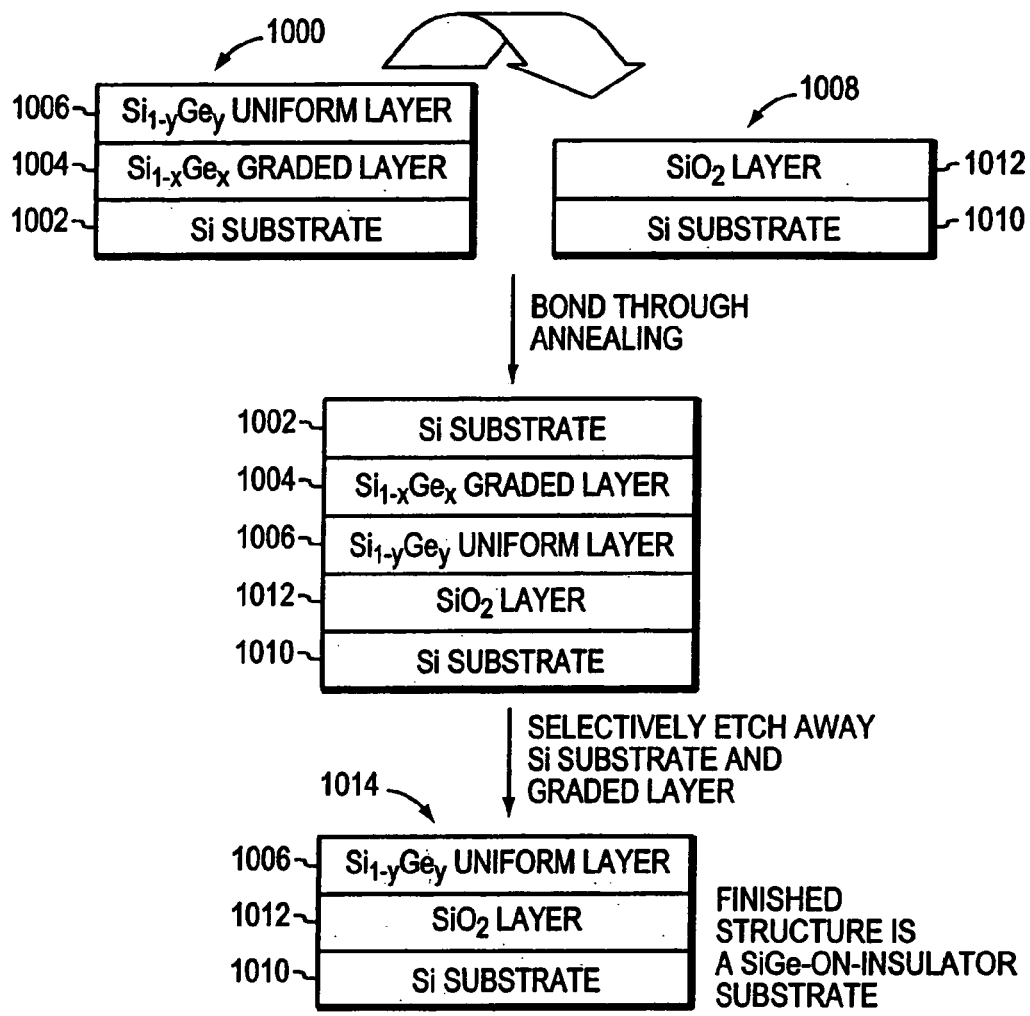
FIG. 10 is a block diagram of a process for fabricating an SiGe-on-insulator structure.

The relaxed SiGe alloys of the invention are ideally suited for this type of etch stop. By bonding a structure 1000 of a graded SiGe layer 1004 and a uniform composition layer 1006 on a silicon wafer 1002 to a structure 1008 having a silicon wafer 1010 coated with silicon dioxide 1012, the etch-stop of the invention can be used to create a very uniform relaxed SiGe alloy on silicon dioxide, which in turn is on a silicon wafer. This process is shown schematically in FIG. 10.

Once the structures are bonded through, for example, annealing, the silicon substrate 1002 and graded layer 1004 are selectively etched away. The finished structure 1014 is a SiGe-on-insulator substrate. It will be appreciated that the structure 1008 can also be a bulk insulating material, such as glass or a glass ceramic.

An entire new materials system from which to make highly effective etch stops has been developed. The new system offers many advantages over current technologies. Germanium is isoelectronic to and perfectly soluble in silicon, and hardly diffuses in it. The deposition of silicon-germanium is selective with respect to oxide. Defects do not weaken the etch-stop efficacy. The etch-stop material can be completely undoped, and according to the proposed band structure model, nondegenerate doping does not influence the etch-stop behavior. This affords incredible utility and design flexibility, especially to integration with microelectronics. To this end, germanium would even afford higher carrier mobilities.

In fact, this etch stop system can easily be used to integrate various strained Si electronics on relaxed SiGe on any desired substrate (eg, insulating or semiconductor substrates), where one such system is SiGe on insulator (Si-GeOI). More details of this procedure are provided in the following description.

The main approaches for the fabrication of semiconductors on insulator are separation-by-implanted-oxygen (SI-MOX) and wafer bonding (followed by etch-back or Smart-Cut). SIMOX involves implantation by oxygen followed by a high temperature anneal, and hence is attractive due to its apparent simplicity. This technique has shown some success for low Ge compositions, but for higher Ge fractions, in particular for $Si_{0.5}Ge_{0.5}$, the buried oxide structure was not demonstrated, due to the thermodynamic instability of $Si_{1-x}Ge_xO_2$. Simply stated, Ge is not incorporated into the oxide, due to the volatile nature of $GeO_2$, and therefore for high Ge fractions, there are insufficient Si atoms to form a stable oxide. On the other hand, the bonding technique, which involves the bonding of a SiGe wafer to an oxidized handle wafer followed by the removal of excess material, can be applied to any Ge fraction, without the problem of an unstable oxide. In addition, the procedure is general, one can create SiGe on any desired substrate, including any insulating wafer.

The process flow for the bond/etch-back SiGeOI fabrication technique is shown schematically in FIGS. 11A-11F. The process is separated into growth: (a) UHVCVD growth of relaxed SiGe graded buffer followed by CMP, (b) re-growth of strained Si ($\epsilon$-Si) and SiGe bonding layer, and bond/etch-back steps: (c) wafer bonding to insulating substrate, (d) backside grinding, (e) Si etch stopping in the graded layer, (f) SiGe etch stopping on the strained Si.

During the first growth, a relaxed 2.5 μm compositionally graded SiGe buffer 1102, capped with 2 μM of $Si_{0.75}Ge_{0.25}$ was deposited onto a Si substrate 1100 at 900° C. using a UHVCVD reactor. The graded buffer minimizes threading dislocations and ensures that misfit are only present in the graded layers and not in the uniform composition cap, but these underlying misfits still generate strain fields which cause the formation of surface cross-hatch during growth. To eliminate this surface roughness, which would hinder wafer bonding, the wafer was polished (using chemical-mechanical polishing, CMP) until the cross-hatch was no longer visible using Nomarsky microscopy.

Next a strained i structure 1104, consisting of 12 nm of strained Si, followed by a layer 1106 of 150 nm of $Si_{0.75}Ge_{0.25}$, was grown at 650° C. via UHVCVD onto the polished SiGe wafers. The low growth temperature ensures minimal surface exchange and inter-diffusion, and hence guarantees a sharp interface between the Si and SiGe layers. The strained Si layer acts as an etch stop during the final etch step, and depending on the thickness requirement and surface roughness constraint for the strained Si channel, may possibly also be used as a MOSFET device channel.

Figure 12A:
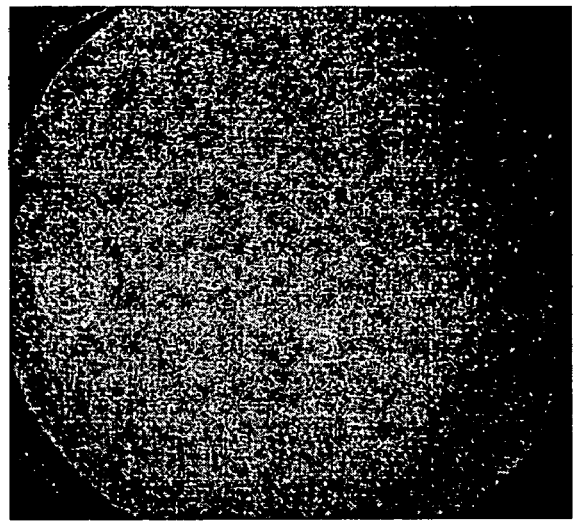
FIGS. 12A and 12B are IR transmission images of intrinsic voids due to particles at the bonding interface, and a demonstration of void-free bonding, and crack due to Maszara surface energy test for SiGe bonded to oxide prior to annealing, respectively.
Figure 12B:
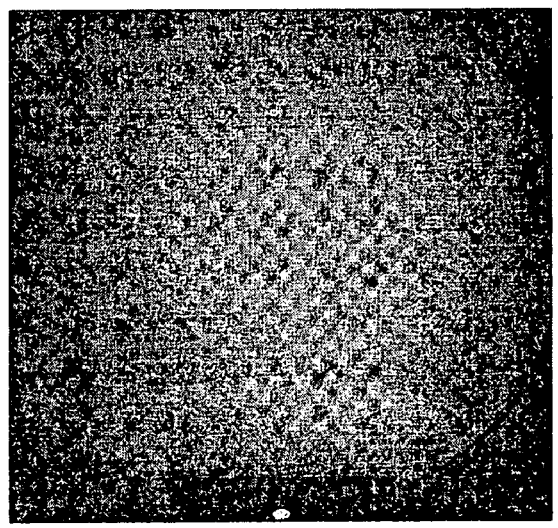

The SiGe wafer was then bonded to a thermally oxidized Si wafer 1108, with an oxide layer 1110 thickness of 200 nm. To ensure adequate bonding, a hydrophobic pre-bonding clean was performed on the wafers. The standard RCA clean cannot be employed for this purpose since the SC1 bath etches Ge and hence roughens the SiGe surface. Instead, a piranha clean (10 minutes) followed by a 50:1 HF dip (30 seconds) was used, which leaves the surface hydrophobic. Such a clean was found to lead to stronger bonding than hydrophilic cleans, after subsequent annealing at moderate temperatures. In addition, the wafers must also be bonded in an ultra-clean environment to ensure no intrinsic voids (as shown in the IR image in FIG. 12A) due to particles at the wafer interfaces.

The wafer pair was annealed for 2 hours at 800° C. in a nitrogen ambient. The moderate temperature ensures strong bonding, but is low enough to minimize the diffusion of Ge into the strained Si layer. In addition, the 2 hour anneal at this temperature allows the intrinsic hydrogen voids formed during initial annealing to diffuse. The resulting pair was found to be void free using infrared imaging, and the fracture surface energy deduced with the Maszara razor test technique (FIG. 13B) was 3.7 $J/m^2$ (which is similar to the surface fracture energy found for Si to oxide bonding), demonstrating that the bonding is indeed strong enough to undergo further material processing, without the risk of delamination.

After bonding the wafers, the pair was coated with nitride to protect the backside of the handle wafer during etching. The backside of the SiGe wafer was then ground as at 1112, removing approximately 450 μm, and a first etch as at 1114 was performed on the wafers to remove the remaining Si from the SiGe wafers. Any etch which attacks Si and not SiGe can be used (eg, KOH, TMAH). For example, a KOH mixture (30% KOH by weight in water) at 80° C., with an etching time of 2 hours can be employed to remove the backside Si from the SiGe wafer. KOH etches do not significantly attack relaxed $Si_{1-x}Ge_x$, with Ge compositions of roughly 20% or higher, and hence stop near the top of the grade in our buffers. Note here that unlike pure Si, or strained SiGe based structures, the relaxed SiGe layer provides a natural etch stop, thus alleviating the need for a $p^{++}$ stop layer. This flexibility of doping as an independent variable with respect to etch-stop capability is important in designing device layers for different applications. For example, $p^{++}$ layers are not desired in RF applications.

Figure 13:
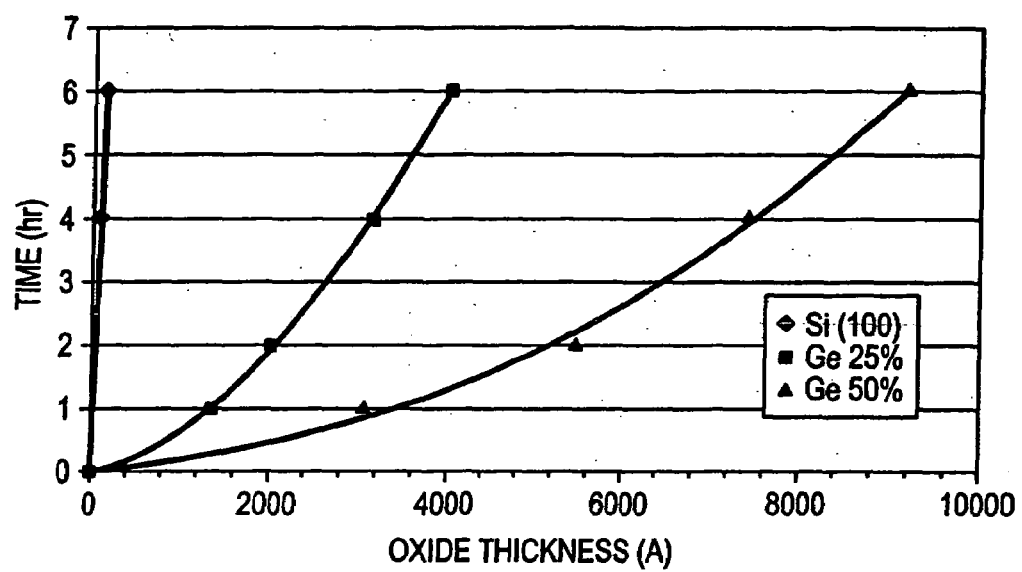
FIG. 13 is a graph of oxide thickness versus oxidation time, for 700° C. wet oxidation of SiGe alloys for various Ge concentration.

The next etch 1116 was employed to remove the remaining SiGe, and stop on the strained Si layer 1104. The active ingredient of this etch consists of any Ge oxidizing agent (eg, $H_2O_2$, $HNO_3$, low temperature wet oxidation), combined with an oxide stripping agent (eg, HF). For example, a low temperature (650° C.-750° C.) wet oxidation has been found to oxidize SiGe at much faster rates than Si, as shown in FIG. 13; for a 1 hour oxidation at 700° C., $Si_{0.75}Ge_{0.25}$ oxidizes at a rate of 2.5 nm/min, whereas Si has an oxidation rate of roughly 100 times smaller. In combination with a subsequent HF dip, the above oxidation can be used to remove very thin layers of SiGe, while stopping on Si.

Figure 14:
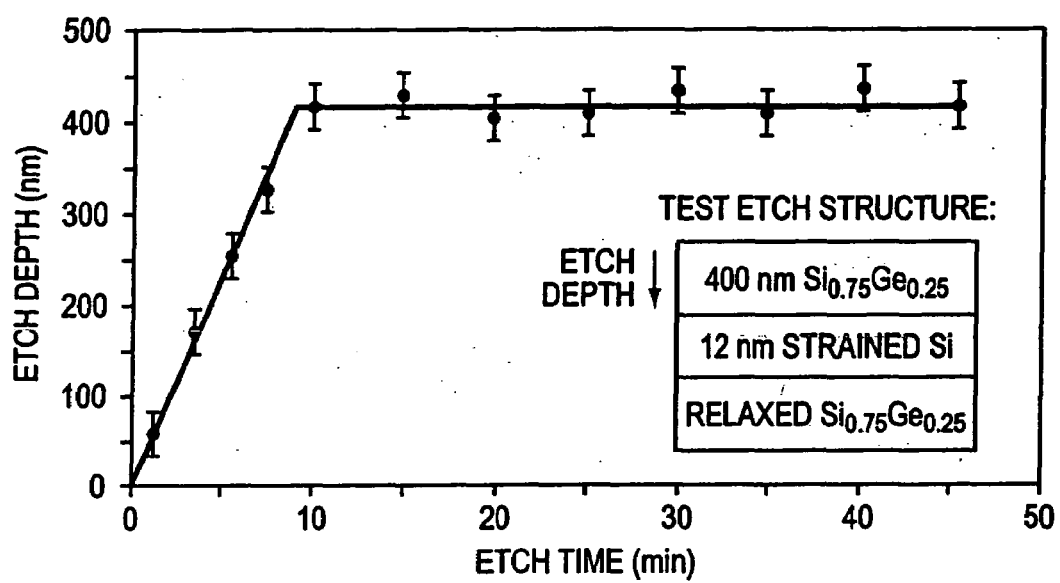
FIG. 14 is a graph showing the etching results using a $HF:H_2O_2:CH_3COOH$ (1:2:3) solution, for the a test structure shown in inset diagram.

A chemical alternative to the above, is a solution of $HF:H_2O_2:CH_3COOH$ (1:2:3), with an etch time of approximately 30 minutes (in the case when the Si etch stops near the 20% Ge region). This has been shown to etch SiGe preferentially, with a very high selectivity; in particular, for relaxed $Si_{0.75}Ge_{0.25}$ versus Si, the selectivity is roughly 300. For demonstration purposes, a test sample consisting of 400 nm relaxed $Si_{0.75}Ge_{0.25}$ on 12 nm strained Si was partially masked and the etch depth versus time was measured using a profilometer. The results in FIG. 14 clearly show the high selectivity, in addition to the relatively fast etch rate of the $Si_{0.75}Ge_{0.25}$ surface layer. An important observation is that the solution was found to etch dislocation threads on the strained Si stop layer preferentially, causing pitting, which in turn lead to breeches in the strained Si layer when the etch time was prolonged.

Figure 15:
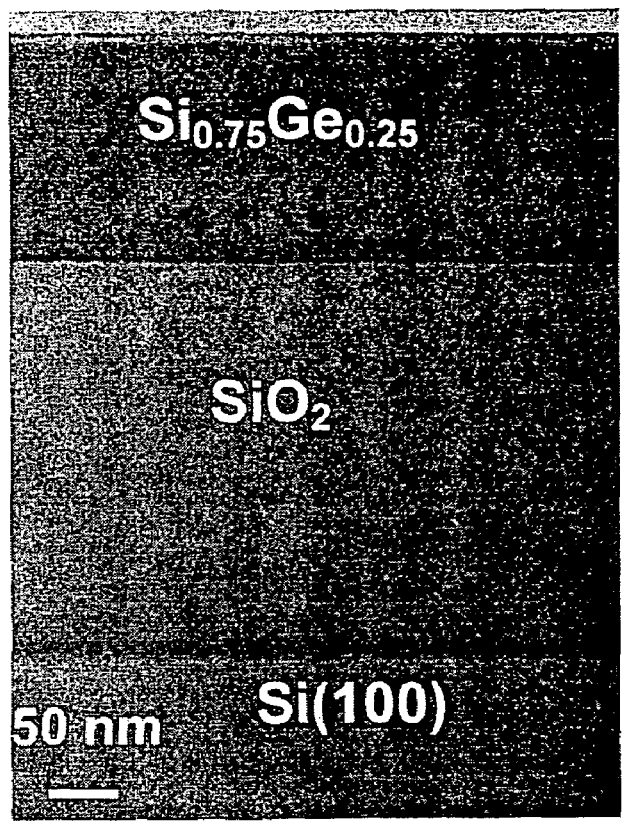
FIG. 15 is a cross-sectional TEM micrograph of a final exemplary SiGe on oxide structure.

FIG. 15 shows a TEM cross-sectional image of the SiGeOI structure fabricated using the proposed technique. No structural defects, such as threading dislocations, were observed in the cross-sectional TEM of the SiGe layer. A low density of threads in the $10^5$ $cm^{-2}$ range was confirmed via EPD (etch pit density) of both the as-grown and bonded SiGe, which proves that there is no substantial increase in threading dislocations due to the proposed process. This is in contrast to SIMOX, which can possibly introduce many additional defects depending on the material system being implanted. In particular, the threading dislocation for implanted SiGe of various Ge fractions has not yet been reported in the literature.

Figure 16:
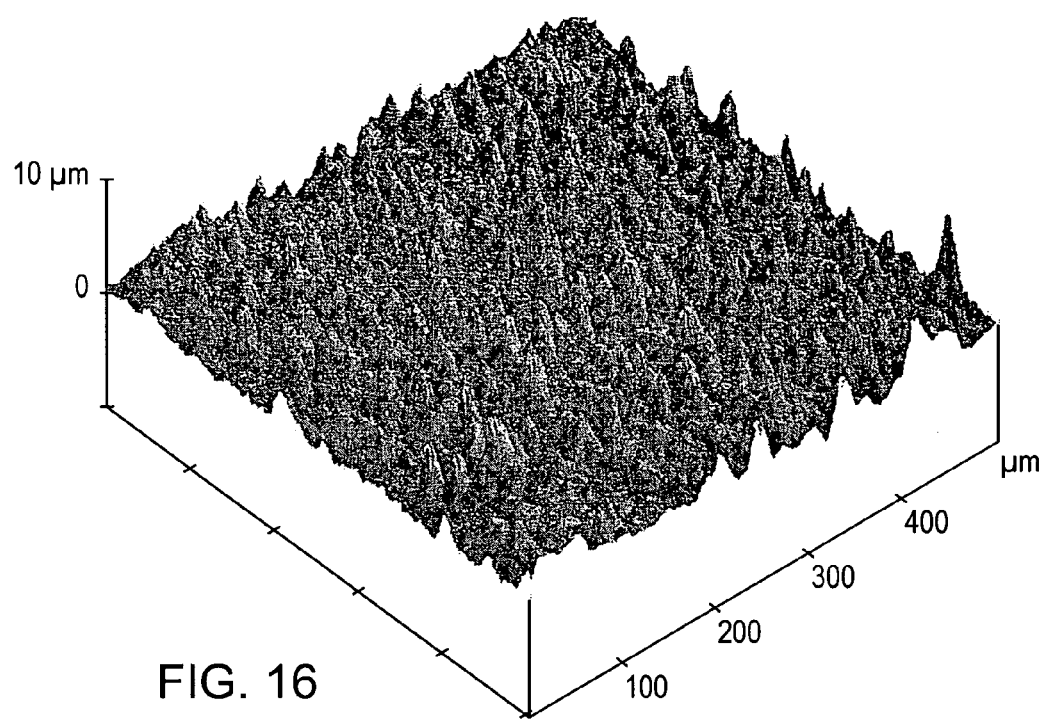
FIG. 16 is an atomic force microscope surface map of the remaining strained Si layer in the SiGeOI structure, after the 30 minute $HF:H_2O_2:CH_3COOH$ (1:2:3) etch.

An AFM scan of the strained Si surface after the final etching, is shown in FIG. 16. The rms roughness was found to be roughly 1.0 nm, with a maximum peak-to-valley difference of 6.4 nm. This demonstrates that although the HF:H$_2$O$_2$:CH$_3$COOH (1:2:3) SiGe etch, has a good selectivity, it leaves the strained Si layer moderately rough. Hence, when using this etch, the Si etch stop layer might not be smooth enough to double as a device channel, since the surface roughness may affect device performance. If this is so, the easiest and most general approach simply requires the removal of the Si etch stop layer with KOH, or any another Si etch that is selective to the Ge composition being used. The desired device structure can then be grown onto the SiGeOI substrate, including a strained Si surface channel or any other more elaborate structure.

An alternative approach, especially in the case of buried channel devices, would involve the incorporation of the device channel layers into the bonding structure. Either avenue is easily attainable using our flexible bonding/etch-back process. Using this general approach, the benefits of an insulating substrate (or for that matter, any substrate) can easily be applied to any SiGe device, without any constraints on SiGe thickness, Ge composition or insulating layer thickness or type.

Although the present invention has been shown and described with respect to several preferred embodiments thereof, various changes, omissions and additions to the form and detail thereof, may be made therein, without departing from the spirit and scope of the invention.

What is claimed is:

1. A semiconductor structure comprising:
a layer structure comprising a uniform etch-stop layer having a doping level below $10^{18}$ atoms/cm$^3$ and a substantially relaxed graded layer,
wherein the uniform etch-stop layer comprises substantially relaxed Si$_{1-y}$, and y>0.19.

2. A semiconductor structure comprising:
a layer structure including a uniform etch-stop layer having a doping level below $10^{18}$ atoms/cm$^3$,
wherein the layer structure comprises a substantially relaxed layer disposed under the uniform etch-stop layer and a first strained layer disposed over the uniform etch-stop layer.

3. The semiconductor structure of claim 2, wherein the first strained layer comprises Si$_{1-z}$Ge$_z$ and $0 \leq z < 1$.

4. A semiconductor structure, comprising
a layer structure including a strained Si$_{1-z}$Ge$_z$ layer, and
a handle wafer comprising an insulator, the layer structure being bonded to the handle wafer,
wherein $0 \leq z < 1$, the layer structure includes a substantially relaxed uniform etch-stop layer disposed over a substantially relaxed layer comprising graded Si$_{1-x}$Ge$_x$, the strained Si$_{1-z}$Ge$_z$ layer is disposed over the uniform etch-stop layer, and the uniform etch-stop layer has a relative etch rate which is less than approximately the relative etch rate of Si doped with 7×10$^{19}$ boron atoms/cm$^3$.

5. A semiconductor structure comprising:
a layer structure including a strained Si$_{1-z}$Ge$_z$ layer;
a handle wafer comprising an insulator, the layer structure being bonded to the handle wafer; and
an insulator layer disposed over the layer structure,
wherein $0 \leq z < 1$, the layer structure includes a substantially relaxed uniform etch-stop layer disposed over a substantially relaxed layer, the strained Si$_{1-z}$Ge$_z$ layer is disposed over the uniform etch-stop layer, and the uniform etch-stop layer has a relative etch rate which is less than approximately the relative etch rate of Si doped with 7×10$^{19}$ boron atoms/cm$^3$.

6. A semiconductor structure comprising:
a layer structure including a strained Si$_{1-z}$Ge$_z$ layer; and
a handle wafer comprising an insulator, the layer structure being bonded to the handle wafer,
wherein $0 \leq z < 1$, the layer structure comprises a substantially relaxed uniform etch-stop layer and substantially relaxed graded layer disposed over the substantially relaxed layer, the strained Si$_{1-z}$Ge$_z$ layer is disposed over the uniform etch-stop layer, and the uniform etch-stop layer has a relative etch rate which is less than approximately the relative etch rate of Si doped with 7×10$^{19}$ boron atoms/cm$^3$.

7. The semiconductor structure of claim 6, wherein the substantially relaxed graded layer comprises Si$_{1-x}$Ge$_x$.

8. A semiconductor structure comprising:
a first uniform etch-stop layer;
a second etch-stop layer disposed over the uniform etch-stop layer;
a substantially relaxed layer disposed over the second etch-stop layer;
a substrate disposed over the relaxed layer; and
an insulator layer disposed over the substantially relaxed layer, between the relaxed layer and the substrate,
wherein the first uniform etch-stop layer has a relative etch rate which is less than approximately the relative etch rate of Si doped with 7×10$^{19}$ boron atoms/cm$^3$.

9. A semiconductor structure comprising:
a first uniform etch-stop layer;
a second etch-stop layer disposed over the uniform etch-stop layer;
a substantially relaxed layer disposed over the second etch-stop layer; and
a substantially relaxed graded layer,
wherein the first uniform etch-stop layer is disposed over the graded layer and the first uniform etch-stop layer has a relative etch rate which is less than approximately the relative etch rate of Si doped with 7×10$^{19}$ boron atoms/cm$^3$.

10. The semiconductor structure of claim 9, wherein the substantially relaxed graded layer comprises Si$_{1-x}$Ge$_x$.

11. The semiconductor structure of claim 9, further comprising:
a first substrate,
wherein the substantially relaxed graded layer is disposed on the first substrate.

12. A method for forming a semiconductor structure, the method comprising:
forming a uniform etch-stop layer;
providing a handle wafer; and
bonding the uniform etch-stop layer directly to the handle wafer,
wherein said uniform etch-stop layer has a relative etch rate which is less than approximately the relative etch rate of Si doped with 7×10$^{19}$ boron atoms/cm$^3$.

13. The method of claim 12, wherein the uniform etch-stop layer comprises substantially relaxed Si$_{1-y}$Ge$_y$.

14. The method of claim 12, further comprising:
planarizing a surface of the uniform etch-stop layer prior to bonding.

15. A method for forming a semiconductor structure, the method comprising:
forming a uniform etch-stop layer;
providing a handle wafer;
bonding the uniform etch-stop layer to the handle wafer; and
forming a substantially relaxed graded layer before forming the uniform etch-stop layer,
wherein the uniform etch-stop layer is formed over the substantially relaxed graded layer and said uniform etch-stop layer has a relative etch rate which is less than approximately the relative etch rate of Si doped with $7 \times 10^{19}$ boron atoms/cm$^3$.

16. The method of claim 15, wherein the relaxed graded layer comprises $Si_{1-x}Ge_x$.

17. The method of claim 15, further comprising:
releasing the etch-stop layer by removing at least a portion of the graded layer.

18. The method of claim 15, wherein releasing the etch-stop layer comprises a wet etch.

19. The method of claim 15, further comprising:
providing a semiconductor substrate,
wherein the substantially relaxed graded layer is formed over the semiconductor substrate.

20. A method for forming a semiconductor substrate, the method comprising:
providing a first substrate;
forming a layer structure over the first substrate by:
forming a uniform etch-stop layer over the first substrate; and
forming a strained layer over the uniform etch-stop layer; and
releasing the strained layer by removing at least a portion of the uniform etch-stop layer,
wherein the uniform etch-stop layer has a relative etch rate which is less than approximately the relative etch rate of Si doped with $7 \times 10^{19}$ boron atoms/cm$^3$.

21. The method of claim 20, wherein releasing the strained layer comprises a wet etch.

22. A method comprising:
providing a first substrate;
forming a layer structure over the first substrate by:
forming a substantially relaxed graded layer over the first substrate;
forming a uniform etch-stop layer over the graded layer;
forming a strained layer over the uniform etch-stop layer; and
releasing the strained layer by removing at least a portion of the graded layer and at least a portion of the uniform etch-stop layer,
wherein the uniform etch-stop layer has a relative etch rate which is less than approximately the relative etch rate of Si doped with $7 \times 10^{19}$ boron atoms/cm$^3$.

23. The method of claim 22, wherein releasing the strained layer comprises a wet etch.

24. A method for forming a semiconductor structure, the method comprising:
forming a layer structure by:
forming a uniform etch-stop layer; and
forming a strained $Si_{1-z}Ge_z$ layer over the uniform etch-stop layer, and
bonding the layer structure to a handle wafer comprising an insulator; and
releasing the strained layer by removing at least a portion of the uniform etch-stop layer,
wherein $0 \leq z < 1$ and the uniform etch-stop layer has a relative etch rate which is less than approximately the relative etch rate of Si doped with $7 \times 10^{19}$ boron atoms/cm$^3$.

25. The method of claim 24, wherein releasing the strained layer comprises a wet etch.

26. A method for forming a semiconductor structure, the method comprising:
forming a layer structure by:
forming a substantially relaxed graded layer;
forming a uniform etch-stop layer over the substantially graded layer; and forming a strained $Si_{1-z}Ge_z$ layer over the uniform etch-stop layer, and
bonding the layer structure to a handle wafer comprising an insulator,
wherein $0 \leq z < 1$ and the uniform etch-stop layer has a relative etch rate which is less than approximately the relative etch rate of Si doped with $7 \times 10^{19}$ boron atoms/cm$^3$.

27. The method of claim 26, wherein the relaxed graded layer comprises $Si_{1-x}Ge_x$.

28. The method of claim 26, further comprising:
releasing the strained layer by removing at least a portion of the graded layer and at least a portion of the uniform etch-stop layer.

29. The method of claim 28, wherein releasing the strained layer comprises a wet etch.

30. The method of claim 26, further comprising:
forming an insulator layer over the layer structure.

31. The method of claim 26, further comprising:
providing a substrate,
wherein the layer structure is formed over the substrate.

32. The method of claim 31, further comprising:
releasing the strained layer by removing at least a portion of the substrate, at least a portion of the graded layer, and at least a portion of the uniform etch-stop layer.

33. The method of claim 32, wherein releasing the strained layer comprises a wet etch.

34. A method for forming a semiconductor structure, the method comprising:
forming a strained etch-stop layer; and
forming a substantially relaxed $Si_{1-w}Ge_w$ layer directly over and in contact with the etch-stop layer,
wherein $w > 0$, the etch-stop layer comprises $Si_{1-z}Ge_z$, and $z = 0$.

35. A method for forming a semiconductor structure, the method comprising:
forming a first uniform etch-stop layer;
forming a second etch-stop layer over the uniform etch-stop layer; and
forming a substantially relaxed layer over the second etch-stop layer,
wherein the first uniform etch-stop layer has a relative etch rate which is less than approximately the relative etch rate of Si doped with $7 \times 10^{19}$ boron atoms/cm$^3$, the second etch-stop layer comprises strained $Si_{1-z}Ge_z$, and $z = 0$.

36. A method for forming a semiconductor structure, the method comprising:
forming a first uniform etch-stop layer;
forming a second etch-stop layer over the uniform etch-stop layer;
forming a substantially relaxed layer over the second etch-stop layer;
bonding the substantially relaxed layer to a substrate comprising an insulator; and
releasing the second etch-stop layer by removing at least a portion of the first etch-stop layer,
wherein the first uniform etch-stop layer has a relative etch rate which is less than approximately the relative etch rate of Si doped with $7 \times 10^{19}$ boron atoms/cm$^3$.

37. The method of claim 36, wherein releasing the second etch-stop layer comprises a wet etch.

38. The method of claim 36, further comprising:
releasing the substantially relaxed layer by removing at least a portion of the second etch-stop layer.

39. The method of claim 36, wherein releasing the substantially relaxed layer comprises a wet etch.

40. A method for forming a semiconductor structure, the method comprising:
forming a first uniform etch-stop layer;
forming a second etch-stop layer over the uniform etch-stop layer; and
forming a substantially relaxed layer over the second etch-stop layer,
forming a substantially relaxed graded layer,
wherein the first uniform etch-stop layer has a relative etch rate which is less than approximately the relative etch rate of Si doped with $7 \times 10^{19}$ boron atoms/cm$^3$, and the first uniform etch-stop layer is formed on the graded layer.

41. The method of claim 40, wherein the substantially relaxed graded layer comprises $Si_{1-x}Ge_x$.

42. The method of claim 40, further comprising:
bonding the substantially relaxed layer to a substrate comprising an insulator.

43. The method of claim 40, further comprising:
releasing the first etch-stop layer by removing at least a portion of the relaxed graded layer.

44. The method of claim 43,
wherein releasing the first etch-stop layer comprises a wet etch.

45. The method of claim 43, further comprising:
releasing the second etch-stop layer by removing at least a portion of the first etch-stop layer.

46. The method of claim 45, further comprising:
releasing the relaxed layer by removing at least a portion of the second etch-stop layer.

47. The method of claim 46, wherein releasing the relaxed layer comprises a wet etch.

48. The method of claim 43, wherein releasing the second etch-stop layer comprises a wet etch.

49. A method for forming a semiconductor structure, the method comprising:
providing a first substrate; and
forming a layer structure over the first substrate by:
forming a substantially relaxed graded layer over the first substrate,
forming a first uniform etch-stop layer over the graded layer,
forming a second etch-stop layer over the uniform etch-stop layer, and
forming a substantially relaxed layer over the second etch-stop layer,
wherein the first uniform etch-stop layer has a relative etch rate which is less than approximately the relative etch rate of Si doped with $7 \times 10^{19}$ boron atoms/cm$^3$, and the layer structure comprises the substantially relaxed graded layer, the first uniform etch-stop layer, the second etch-stop layer, and the substantially relaxed layer.

50. The method of claim 49, wherein the substantially relaxed graded layer comprises $Si_{1-x}Ge_x$.

51. The method of claim 49, wherein the first uniform etch-stop layer comprises substantially relaxed $Si_{1-y}G_y$, the second etch-stop layer comprises strained $Si_{1-z}Ge_z$, $0 \leq z < 1$, and the substantially relaxed layer comprises $Si_{1-w}Ge_w$.

52. The method of claim 49, further comprising:
bonding the layer structure to a second substrate including an insulator.

53. The method of claim 52, wherein the second substrate comprises a material selected from the group consisting of silicon, glass, quartz, and silicon dioxide.

54. The method of claim 49, the method further comprising:
releasing the first etch-stop layer by removing at least a portion of the first substrate and at least a portion of the graded layer; and
releasing the second etch-stop layer by removing at least a portion of the first etch-stop layer.

55. The method of claim 54, further comprising:
bonding the layer structure to a second substrate prior to releasing the first etch-stop layer.

56. The method of claim 54, further comprising:
releasing at least a portion of the relaxed layer by removing at least a portion of the second etch-stop layer.

57. A method for forming a semiconductor structure, the method comprising:
providing a first substrate;
forming a layer structure on the first substrate by:
forming a substantially relaxed graded layer on the first substrate; and
forming a uniform etch-stop layer on the graded layer; and
releasing the etch-stop layer by removing at least a portion of the substrate and at least a portion of the graded layer,
wherein the uniform etch-stop layer of $Si_{1-y}Ge_y$ has a relative etch rate which is less than approximately the relative etch rate of Si doped with $7 \times 10^{19}$ borons/cm$^3$.

58. The method of claim 57, wherein the substantially relaxed graded layer comprises $Si_{1-x}Ge_x$.

59. The method of claim 57, wherein the uniform etch-stop layer comprises substantially relaxed $Si_{1-y}Ge_y$.

60. The method of claim 57, further comprising:
bonding the layer structure to a second substrate prior to releasing the etch-stop layer.

61. A semiconductor structure comprising:
a layer structure including a uniform etch-stop layer having a doping level below $10^{18}$ atoms/cm$^3$,
wherein the etch-stop layer comprises n-type dopants.

62. A semiconductor structure comprising:
a layer structure including a uniform etch-stop layer,
wherein the etch-stop layer comprises p-type dopants and the doping level is below $4 \times 10^{16}$ atoms/cm$^3$.

63. A method for forming a semiconductor structure, the method comprising:
forming a layer structure including a uniform etch-stop layer;
providing a handle wafer; and
bonding the layer structure directly to the handle wafer,
wherein said uniform etch-stop layer has a relative etch rate which is less than approximately the relative etch rate of Si doped with $7 \times 10^{19}$ boron atoms/cm$^3$.

64. A semiconductor structure comprising:
a layer structure comprising a uniform etch-stop layer, the etch-stop layer comprising SiGe and having a doping level below $10^{18}$ atoms/cm$^3$, and a substantially relaxed layer,
wherein the relaxed layer is graded.

65. A semiconductor structure comprising:
a layer structure comprising a uniform etch-stop layer, the etch-stop layer comprising SiGe and having a doping level below $10^{18}$ atoms/cm$^3$, and a substantially relaxed layer comprising $Si_{1-x}Ge_x$,
wherein the relaxed layer is graded and x<0.2.

66. A method for forming a semiconductor structure comprising:
providing a first substrate; and
forming a layer structure over the first substrate by:
forming a substantially relaxed graded layer over the first substrate, and forming a uniform etch-stop layer over the graded layer, the uniform etch-stop layer comprising SiGe and having a doping level below $10^{18}$ atoms/cm$^3$.

* * * * *